(12) United States Patent
Lidow et al.

(10) Patent No.: US 10,312,131 B2
(45) Date of Patent: Jun. 4, 2019

(54) SEMICONDUCTOR DEVICES WITH BACK SURFACE ISOLATION

(71) Applicant: Efficient Power Conversion Corporation, El Segundo, CA (US)

(72) Inventors: Alexander Lidow, Santa Monica, CA (US); Jianjun Cao, Torrance, CA (US); Robert Beach, La Crescenta, CA (US); Johan T. Strydom, San Jose, CA (US); Alana Nakata, Redondo Beach, CA (US); Guangyuan Zhao, Torrance, CA (US)

(73) Assignee: Efficient Power Converson Corporation, El Segundo, CA (US)

( * ) Notice: Subject to any disclaimer, the term of this patent is extended or adjusted under 35 U.S.C. 154(b) by 42 days.

(21) Appl. No.: 15/434,611

(22) Filed: Feb. 16, 2017

(65) Prior Publication Data

US 2017/0162429 A1    Jun. 8, 2017

Related U.S. Application Data

(63) Continuation of application No. 13/325,735, filed on Dec. 14, 2011, now Pat. No. 9,607,876.

(Continued)

(51) Int. Cl.
| | | |
|---|---|---|
| *H01L 21/74* | (2006.01) | |
| *H01L 21/761* | (2006.01) | |
| *H01L 21/762* | (2006.01) | |
| *H01L 21/8252* | (2006.01) | |
| *H01L 21/8258* | (2006.01) | |
| *H01L 29/20* | (2006.01) | |
| *H01L 29/732* | (2006.01) | |
| *H01L 29/778* | (2006.01) | |

(Continued)

(52) U.S. Cl.
CPC .......... *H01L 21/743* (2013.01); *H01L 21/761* (2013.01); *H01L 21/76283* (2013.01); *H01L 21/8252* (2013.01); *H01L 21/8258* (2013.01); *H01L 23/535* (2013.01); *H01L 27/0605* (2013.01); *H01L 27/0688* (2013.01); *H01L 27/085* (2013.01); *H01L 29/2003* (2013.01); *H01L 29/732* (2013.01); *H01L 29/7787* (2013.01); *H01L 29/7827* (2013.01); *H01L 29/88* (2013.01); *H01L 29/7786* (2013.01); *H01L 2924/0002* (2013.01)

(58) Field of Classification Search
None
See application file for complete search history.

(56) References Cited

U.S. PATENT DOCUMENTS 5,552,622 A    9/1996  Kimura
5,889,293 A    3/1999  Rutten et al.
(Continued)

FOREIGN PATENT DOCUMENTS

JP    2003-258005 A    9/2003
JP    2008-235740 A    10/2008
(Continued)

*Primary Examiner* — Jay C Chang
(74) *Attorney, Agent, or Firm* — Blank Rome LLP

(57) ABSTRACT

Circuits, structures and techniques for independently connecting a surrounding material in a part of a semiconductor device to a contact of its respective device. To achieve this, a combination of one or more conductive wells that are electrically isolated in at least one bias polarity are provided.

4 Claims, 43 Drawing Sheets

Related U.S. Application Data

(60) Provisional application No. 61/423,157, filed on Dec. 15, 2010.

(51) Int. Cl.
  *H01L 27/06* (2006.01)
  *H01L 27/085* (2006.01)
  *H01L 23/535* (2006.01)
  *H01L 29/78* (2006.01)
  *H01L 29/88* (2006.01)

(56) References Cited

U.S. PATENT DOCUMENTS

| | | |
|---|---|---|
| 6,537,861 B1 | 3/2003 | Kroell et al. |
| 6,589,845 B1 | 7/2003 | Nair |
| 6,611,002 B2 | 8/2003 | Weeks et al. |
| 7,078,743 B2 | 7/2006 | Murata et al. |
| 7,339,207 B2 | 3/2008 | Murata et al. |
| 7,361,946 B2 | 4/2008 | Johnson et al. |
| 2003/0186555 A1* | 10/2003 | Liang ............... H01L 21/31116 438/724 |
| 2004/0099888 A1 | 5/2004 | Sriram |
| 2006/0060895 A1 | 3/2006 | Hikita |
| 2008/0006904 A1 | 1/2008 | Mun |
| 2008/0023706 A1 | 1/2008 | Saito et al. |
| 2008/0272408 A1 | 11/2008 | Vora |
| 2008/0315257 A1* | 12/2008 | Shiraishi ............. H01L 27/0605 257/195 |
| 2009/0008679 A1 | 1/2009 | Saito |
| 2009/0305470 A1 | 12/2009 | Anderson et al. |
| 2010/0301419 A1* | 12/2010 | Anderson ....... H01L 21/823481 257/368 |
| 2011/0108885 A1 | 5/2011 | Sazawa et al. |
| 2012/0153300 A1 | 6/2012 | Lidow et al. |

FOREIGN PATENT DOCUMENTS

| | | |
|---|---|---|
| JP | 2009-212529 A | 9/2009 |
| JP | 2009-231396 A | 10/2009 |

* cited by examiner

SEMICONDUCTOR DEVICES WITH BACK SURFACE ISOLATION

This is a continuation of application Ser. No. 13/325,735, filed Dec. 14, 2011, which claims the benefit of Provisional Application No. 61/423,157, filed Dec. 15, 2010, the disclosures of which are incorporated herein in their entireties.

BACKGROUND OF THE INVENTION

Semiconductor devices use the conductive properties of semiconductor materials. Such semiconductor materials may include, for example, silicon (Si) or Si-containing materials, germanium (Ge), or materials including gallium nitride (GaN).

In particular, GaN semiconductor devices are increasingly desirable for power semiconductor devices because of their ability to carry large current and support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET). These types of devices can typically withstand high voltages while operating at high frequencies.

One example of a GaN HEMT device includes a semiconductor substrate (e.g., a Si substrate) with at least two interior layers. The different interior layers have different band gaps, which causes polarization that contributes to a conductive two-dimensional electron gas (2DEG) region near the junction of the two layers, specifically in the layer with the narrower band gap. In a GaN semiconductor device, the layers that cause polarization typically include a barrier layer of AlGaN formed adjacent to a current conducting layer of GaN. The polarization creates the 2DEG region in the current conducting layer, allowing charge to flow through the device. This barrier layer may be doped or undoped.

Because a 2DEG region typically exists under the gate of a GaN transistor device when the gate is at zero gate bias, most GaN devices are normally on, or depletion mode devices. If the 2DEG region can be depleted, i.e. removed, when the gate is at zero applied gate bias, the GaN device can operate as an enhancement mode device. Enhancement mode devices are normally off and are desirable because of the added safety they provide. An enhancement mode device requires a positive bias applied at the gate in order to conduct current.

FIG. 1 illustrates a conventional GaN transistor device 100. Device 100 includes: a substrate 11, which may be composed of, for example, silicon (Si), silicon carbide (SiC), sapphire, or other material; one or more transition layers 12 formed over the substrate 11, which may be composed of layers of aluminum nitride (AlN) and aluminum gallium nitride (AlGaN) each about 0.1 to about 1.0 µm in thickness; a buffer layer 13 formed over the one or more transition layers 12, which is typically composed of GaN and typically about 0.5 to about 3 µm in thickness; a current conducting region 14 formed over the buffer layer 13 for providing a current conducting channel, which may be composed of GaN or indium gallium nitride (InGaN) typically about 0.01 to about 0.1 µm in thickness; contact regions 15 formed over or beside the current conducting region 14, which are typically composed of AlGaN, Al, titanium (Ti), and Si, and which may typically be about 0.01 to about 0.03 µm in thickness; a barrier layer 16 formed over the current conducting region 14 and between the contact regions 15, which is typically composed of AlGaN where the Al to Ga ratio is about 0.1 to about 1 with a thickness of about 0.01 to about 0.03 µm; a gate structure 17 formed over the barrier layer 16 and composed of p-type GaN with a nickel (Ni) and gold (Au) metal contact; and ohmic contact metals 18, 19 formed over the contact regions 15 at a source and drain contact areas, respectively, which may be composed of Ti and Al with a capping metal such as Ni and Au. Current conducting region 14, contact regions 15, and barrier layer 16 collectively form a device layer that provides for electrical connection to and control of device 100.

FIG. 2 illustrates another conventional GaN transistor device 200. Device 200 includes substrate 21, transition layers 22, buffer layers 24, channel layer 25, contact region 26, barrier layer 27, gate structure 28, and source and drain contact 29 and 30. These layers may have similar parameters as those described for FIG. 1. In addition, device 200 has a through-wafer via 20 that extends from a top side contact (i.e., from source contact 30, as shown in FIG. 2, or from drain contact 29) and through all material layers including the substrate to a metal layer 31 on the bottom side of the substrate 21. Metal layer 31 may be, for example, a heat sink.

FIG. 3 illustrates another GaN transistor device 300. Device 300 includes substrate 41, transition layers 42, buffer layers 43, current conducting region 44 including a channel layer, contact region 45, barrier layer 47, gate structure 48, and source and drain contacts 46 and 49. These layers may have similar parameters as those described for FIGS. 1 and 2. Device 300 includes a substrate connection via 40 that connects substrate 41 to the source contact 49. Unlike the via 20 of semiconductor device 200 (FIG. 2), via 40 of semiconductor device 300 terminates in substrate 41 without extending all the way to the backside of substrate 41.

Via connections such as those described in connection with FIGS. 2 and 3 provide a very low inductance and low resistance path from the back side of the semiconductor device (e.g., the backside of the substrate) to a front side connection of the device (e.g., a source or drain contact, gate structure, or other element). This is important for the high frequency operation for which these devices are intended. Conventional GaN transistor devices 100, 200, and 300 have disadvantages. Device 100 (FIG. 1) has a floating substrate potential when conducting substrates 11, such as Si, are used. This can lead to inadvertent device turn-on if the substrate voltage becomes too positive. In addition, negative substrate voltage can lead to resistance increase of the device 100. Devices 200 and 300 (FIGS. 2, 3) address this problem by electrically tying the respective substrates 21, 41 to the respective contacts 30, 49. For integrated devices, however, the desired substrate potential can be different for each device. Electrically connecting the substrate to the contact may result in some integrated devices having non-optimal substrate potentials.

In addition, it is often desirable to have a heat sink connected on the back side of a device, as shown, for example, with heat sink 31 of device 200 (FIG. 2). Electrically connecting the substrate 21 to the contact 30 may result in an undesirable voltage being present at the heat sink 31, unless intervening insulating material is included between the heat sink 31 and the substrate 21. Including insulating material between the heat sink 31 and the substrate 21, however, can be detrimental to the effectiveness of the heat sink 31. Insulating material adds thermal resistance, and the insulating material between 31 and 21 keeps heat inside the device. It often becomes necessary to include this material nonetheless, such as when multiple devices are used to form a circuit and utilize the same heat sink.

One example where it is undesirable, but often necessary, to include insulating material between the heat sink 31 and the substrate 21 is when two GaN field effect transistors ("FETs") are connected in series to form a buck converter. A first FET in a buck converter has a source connected to ground, and a drain connected to a switch node. The second device has a source connected to the switch node and a drain connected to a high voltage. Thus, the two FET devices are connected to the same potential at the switch node, and are turned on in alternating fashion, such that the switch node voltage alternates between ground and high potential. If the entire substrate is connected to ground (i.e., the first FET device's source potential), then the second device's source will become high in potential relative to the substrate, leading to very large resistance increase in this second FET device. If the substrate potential is set to a switch node voltage, the first device will have high negative potential relative to the substrate beneath the source, and its resistance will become high.

It would therefore be desirable to be able to control the potential under each contact of an integrated semiconductor device independently, while also having the flexibility to set the back side of the semiconductor device at an independent potential.

The GaN family of materials, including AlGaN, InGaN, and InAlGaN, are all direct band gap materials. This leads to unique device behavior, such as light generation when electrons recombine with holes, very short minority carrier lifetimes, and rapid carrier generation during avalanche events. The latter characteristic makes GaN device very difficult to control when an avalanche event occurs, and generally leads to destruction of the part. Si, on the other hand, has an indirect band gap, allowing for smooth and controlled avalanche, and safe device operation under avalanche conditions.

It would therefore be desirable to combine the advantageous avalanche capabilities of the Si based devices with the improved speed and resistance characteristics of GaN in a single device.

SUMMARY OF THE INVENTION

Embodiments described below address the problems discussed above and other problems, by providing for independently connecting a substrate region in a part of a semiconductor device to a contact of its respective device. To achieve this, a combination of one or more implanted wells or diffused conductive regions and via connections are described which provide for isolating the substrate and other elements from each other, while allowing other elements to be tied electrically.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. Also, various methods and processes are described, each including several steps. It should be understood that the steps may be performed in the order described, or in any different order, unless specified otherwise.

While embodiments described herein include GaN semiconductor devices, it should be understood that the invention is not limited to GaN semiconductor devices. For example, the described embodiments may be applicable to semiconductor devices and other devices that use different conductive materials, such as, for example, Si or SiC semiconductor devices and Ge-material semiconductor devices, to name but a few.

In addition, while implanted or diffused conductive regions or wells are described, it should be understood that these are only two processes for providing regions of different polarity within a substrate. Thus, while the described embodiments may refer to implanted or diffused regions or wells, it should be understood that other types of opposite-polarity regions and methods of fabrication thereof may be used.

Described embodiments include a transistor or other semiconductor device, such as a GaN transistor or an integrated circuit including transistors, which has a conductive well that is electrically isolated in at least one bias polarity from surrounding layers or substrate. In some embodiments, a device has a conductive substrate, where regions of the substrate are doped with an oppositely-polarized conductivity to that of the substrate. The regions of opposite polarity may be, for example, an n-type material in a p-type substrate. The device has an electrical connection, such as through a via, from a contact at its front side to the regions of opposite polarity. In other embodiments, the regions may have the same doping type as the substrate, and may be surrounded by one or more insulating layers. In other embodiments, the substrate may be substantially non-conductive, while the regions have either a p-type or n-type doping. In other embodiments, silicon-on-insulator (SOI) embodiments, and embodiments including parallel conducting channels, are also described. The electrical isolation permits independent control of the substrate or other materials under each device and/or under individual contacts within a single device, among other benefits.

Figure 1:
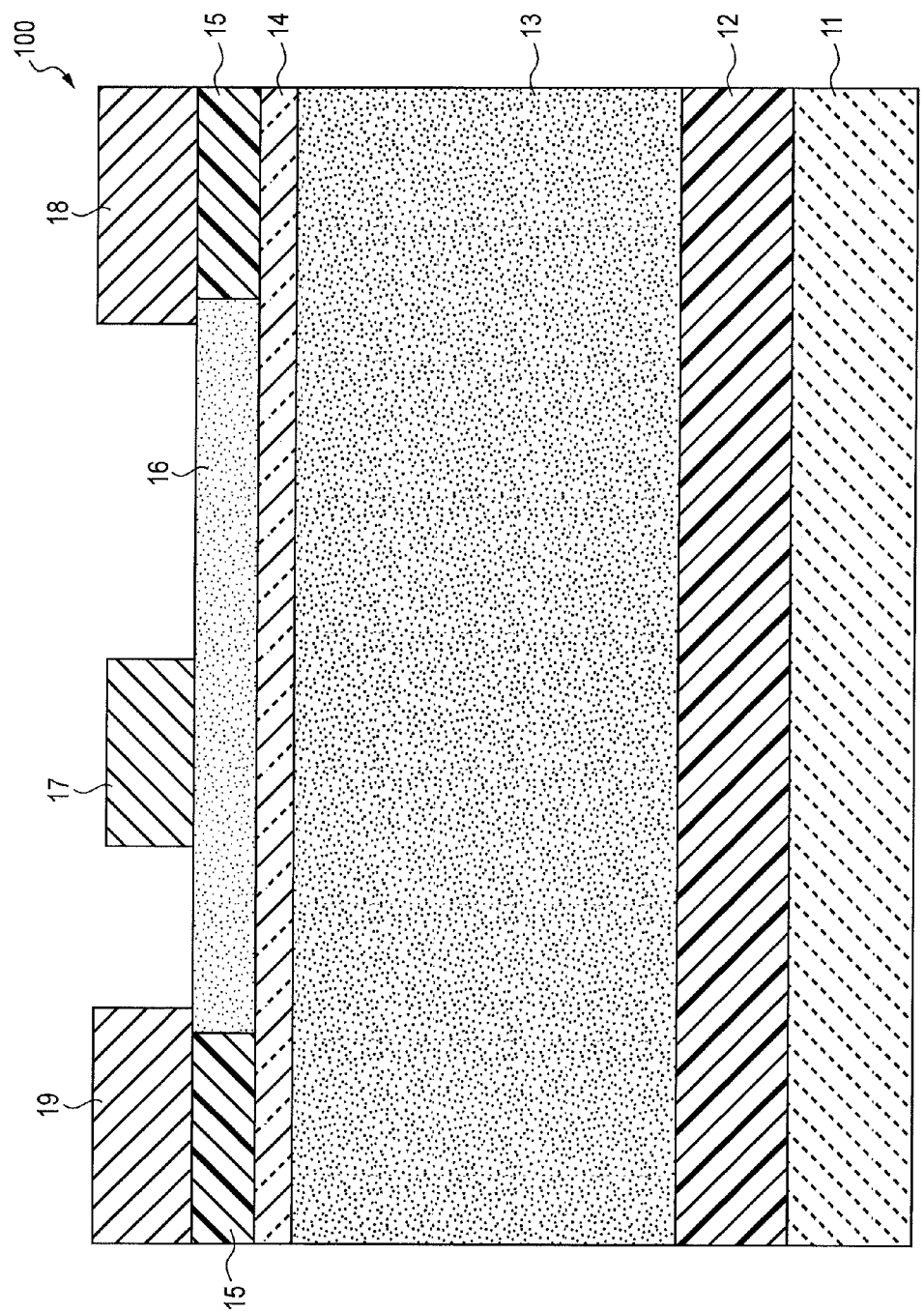
FIG. 1 illustrates a cross-sectional view of a conventional GaN transistor device.
Figure 4A:
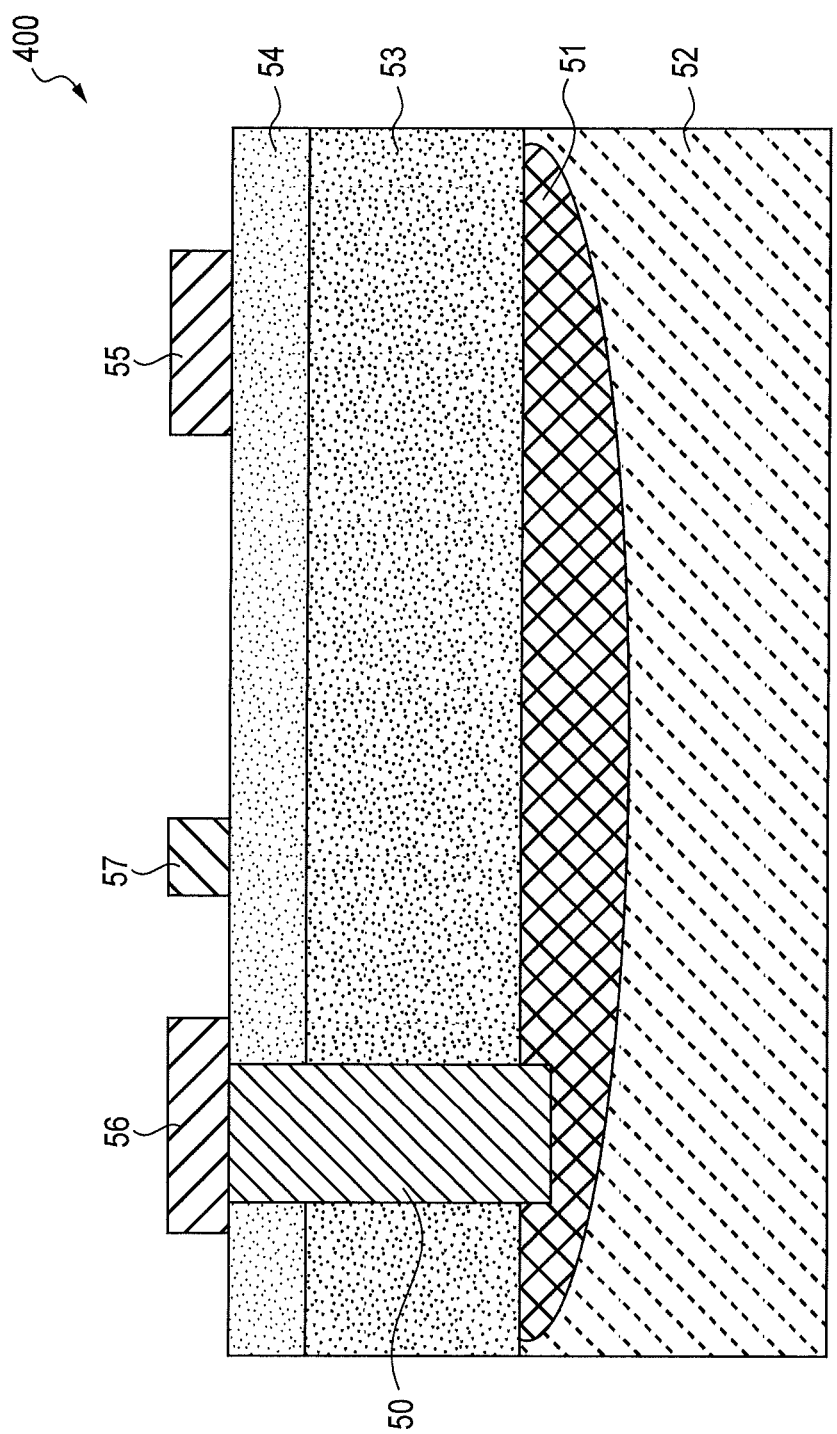
FIG. 4A illustrates a cross-sectional view of a transistor device formed according to a first embodiment of the present invention.

FIG. 4A illustrates a cross-sectional view of a GaN transistor device 400. Device 400 includes: a substrate 52, which may be composed of one or more Si, SiC, GaN, GaAs, aluminum-nitride (AlN), and/or sapphire-based materials; buffer layers 53 formed over substrate 52, which may be composed of one or more layers of compound semiconductor materials (e.g., AlN material) having a thickness in a range of 0.1-0.5 µm, one or more layers of AlGaN having a thickness of 0.1 to 2 um, and one or more layers of GaN having a thickness of 0.01 to 5 µm; and a device layer 54 formed over buffer layers 53, which may include a layer of AlGaN having a thickness of 0.005 to 0.03 µm with 15-100% Al that serves as a barrier layer 16 (FIG. 1). Although not shown for purposes of clarity in explaining other aspects of the embodiments herein, it should be understood that elements for providing electrical connection to and control of device 400 would typically be formed in device layer 54, including a current conducting region 14 (FIG. 1) providing a primary current conducting channel, and contact regions 15 (FIG. 1) under one or both of contacts 55 and 56. The current conducting region may be composed of GaN or indium gallium nitride (InGaN) preferably in a range of about 0.01 to about 0.5 µm in thickness, or other suitable materials known in the art. The contact regions may be composed of AlGaN, Al and titanium (Ti) that may have Si, preferably in a range of about 0.01 to about 0.03 µm in thickness, or other suitable materials known in the art. Device layer 54 may also include a barrier/channel/barrier layer configuration, with a channel layer between two barrier layers.

Device 400 includes contacts 55 and 56 (e.g., source and drain contacts) and a gate structure 57 formed over device layer 54. Contacts 55, 56 may be composed of a mixture of Ti and Al, and gate structure 57 may be composed of p-type GaN and TiN or Ni and Au.

Device 400 also includes a conductive well 51 implanted in substrate 52, and a connection via 50 terminating within the conductive well 51. In one embodiment, substrate 52 can be an n-type substrate with doping between 1e14 and 1e16 electrons/$cm^3$, and conductive well 51 can be a p-type well composed of a boron implanted region with concentration of boron between 1e17 and 1e20 atoms/$cm^3$. Such a device operates at a negative potential in relation to the substrate. In another embodiment, substrate 52 can be a p-type substrate, and well 51 can be an n-type well, providing a device that operates at a positive potential in relation to the substrate. In another embodiment, conductive well 51 can be p-type or n-type, and substrate 52 can be a substantially non-conductive (i.e., intrinsic) substrate. The different polarities electrically isolate conductive well 51 and substrate 52. Connection via 50 can be composed of Al material in a range of 1 to 5 µm thick and a thin layer of TiN in a range of 0.01 to 0.1 µm thick. $SiO_2$ may also be used within or above via 50. Alternatively, tungsten (W) or copper (Cu) plug technologies can be applied to the filling of smaller, higher aspect ratio vias, while utilizing thin layers of TiN in a range of 0.01 to 0.1 um thick for contacting the Si well. The ability to use tungsten or copper technologies for via 50 enables integrating existing charge-coupled device ("CCD") manufacturing process steps to form via 50.

Figure 2:
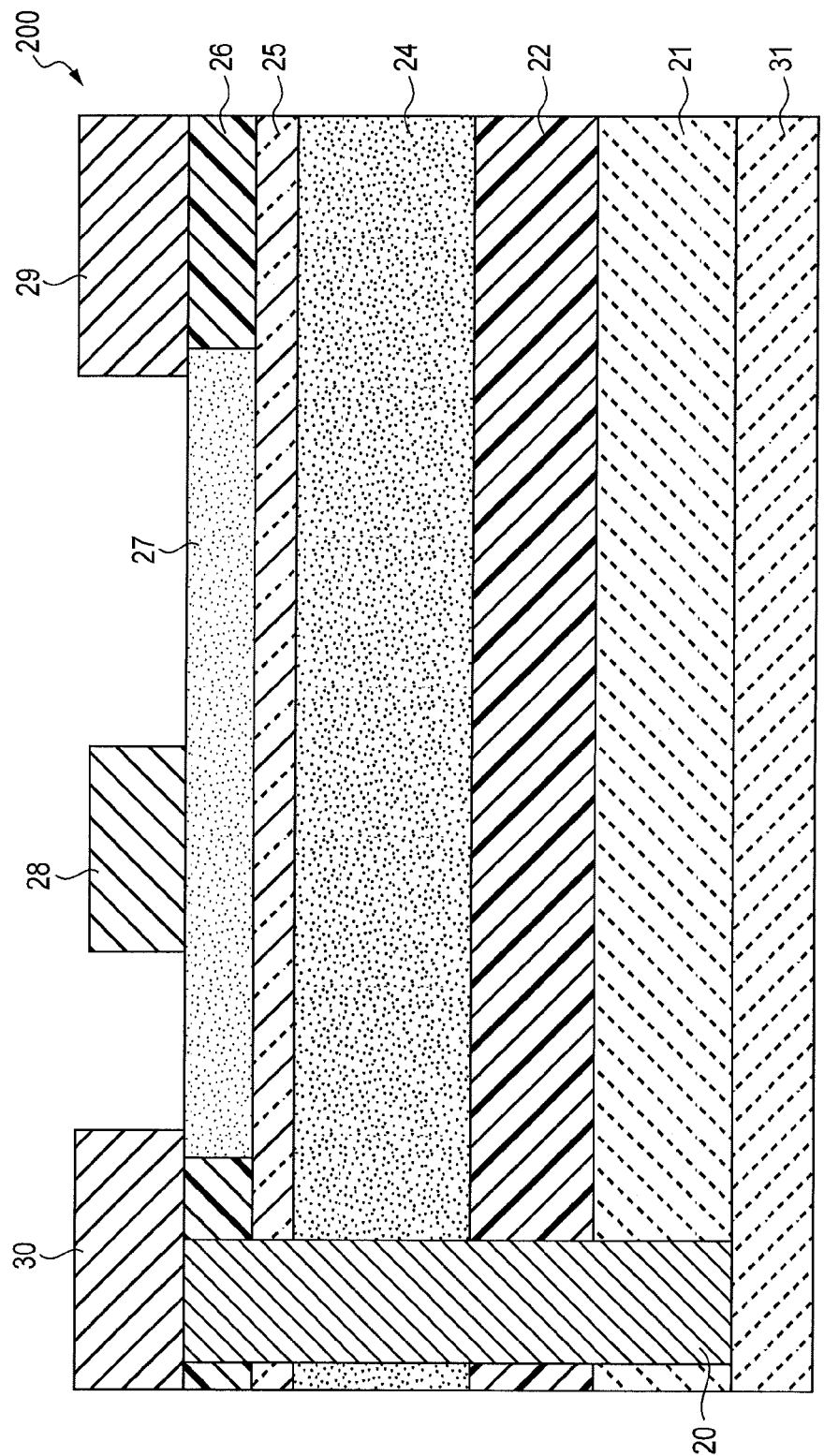
FIG. 2 illustrates a cross-sectional view of a conventional GaN transistor device utilizing a through wafer via.
Figure 3:
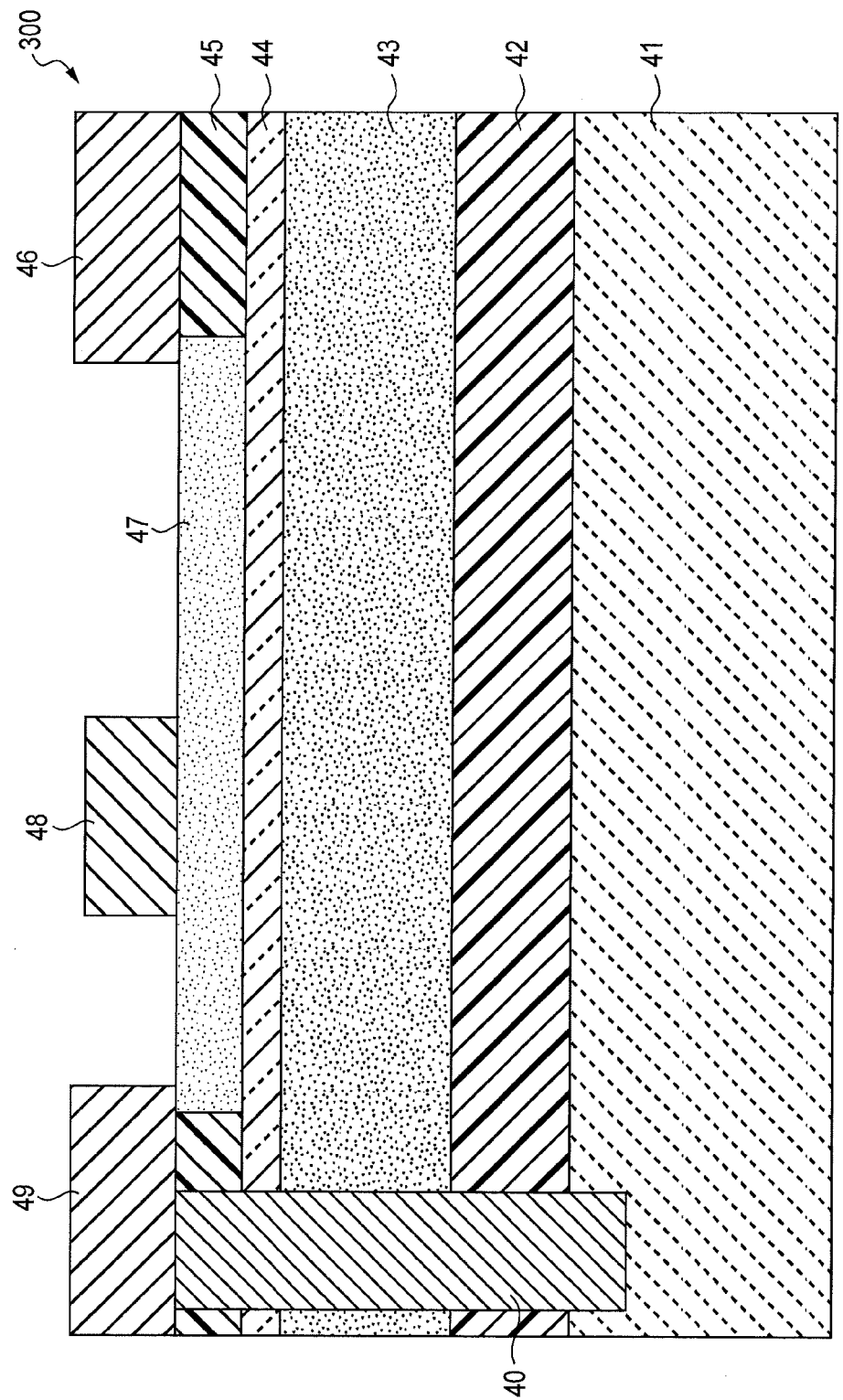
FIG. 3 illustrates a cross section view of a conventional GaN transistor device utilizing a substrate connection via.

Via 50 provides a very low inductance and low resistance path from the back side of the semiconductor device 400 to a front side of the device (e.g., as shown, to a contact 56 at the front side), which is beneficial for high frequency operation of device 400. The presence of well 51 below the device and buffer layers 54, 53 at the back side of the device 400 isolates the back surface potential from the substrate potential. One benefit of isolating the substrate potential is that it allows for a heat sink 31 (FIG. 2) connected at a backside of the substrate 52 to be at a different potential than the device 400.

Figure 4B:
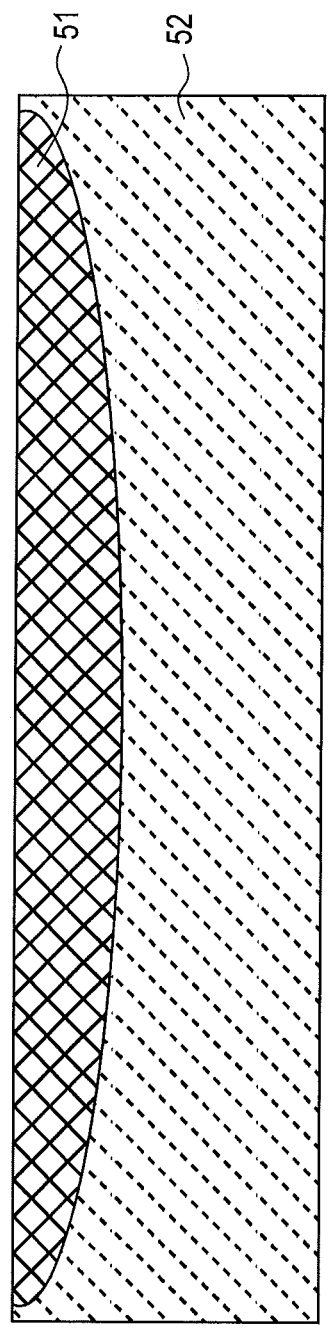
FIGS. 4B-4G illustrate a process for forming the transistor device of FIG. 4A.

A process for fabrication of device 400 will now be described in connection with FIGS. 4B-4G. In FIG. 4B, a substrate 52 is provided, such as on a wafer substrate, and an implanted well region 51 is formed in a surface of substrate 52. Implanted well region 51 can be formed by performing a Si oxidation on substrate 52, developing a photo-resist pattern definition over substrate 52 using photo lithography, exposing substrate 52 to a dopant, such as high energy boron atoms, using an implanter, stripping away the remaining photo-resist, annealing the wafer at high temperatures (e.g., 1100° C.) for an appropriate duration (e.g., 3 hours), and then stripping any surface oxide by immersion in hydrogen-fluoride containing acid.

Figure 4C:
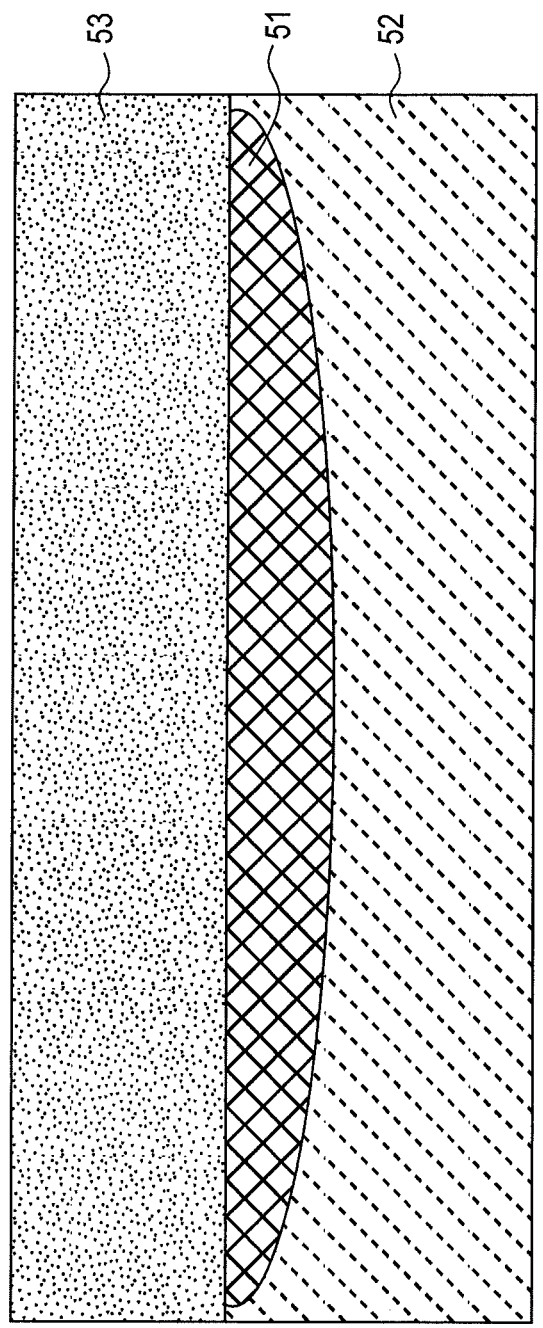

Buffer layer 53, device layer 54 and gate structure 57 can be grown on substrate 52, and material processing to form gate structure 57 and source and drain contacts 55, 56. For example, as shown in FIG. 4C, buffer layers 53 composed of one or more layers of AlN and/or AlGaN materials preferably about 0.1 to about 1.0 µm in thickness, and one or more layers of GaN material preferably with a thickness of about 0.5 to about 3.0 µm, can be formed on substrate 52 using nucleation and growth processes.

Figure 4D:
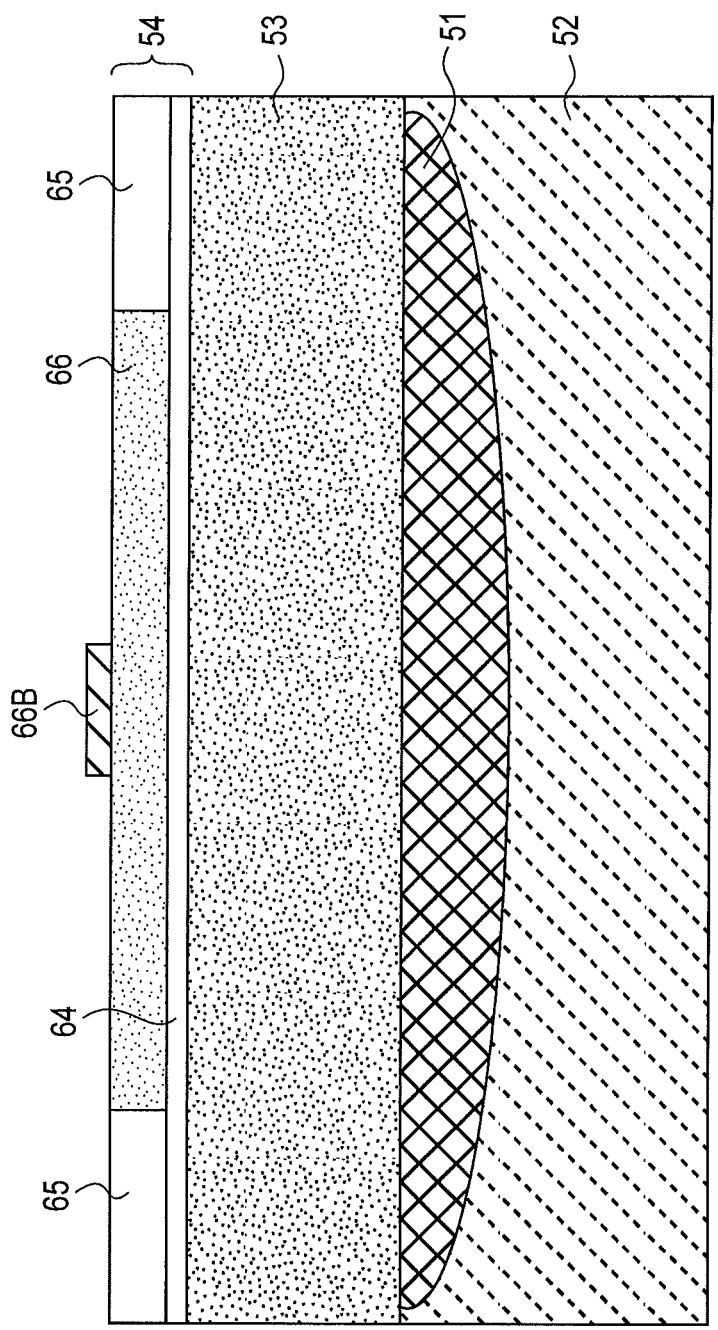

As shown in FIG. 4D, device layer 54 can then be formed on the buffer layers 53. Device layer 54 can include a barrier layer 66 formed above a current conducting region 64 that serves as a primary current channel. Formation of device layer 54 can include depositing a layer of GaN or InGaN material typically about 0.01 to about 0.5 µm in thickness to form current conducting region 64, and depositing a layer of material composed of AlGaN where the Al fraction (which is the content of Al such that Al fraction plus Ga fraction equals 1) is in a range of about 0.1 to about 1.0 and the thickness is in a range between about 0.01 and about 0.03 µm to form barrier layer 66. Device layer 54 may also include depositing a layer of Mg-doped GaN material above layer 66 to form an electron absorption region 66b. Contact regions 65 can be formed by implanting Si into side areas of the deposited barrier layer 66.

Figure 4E:
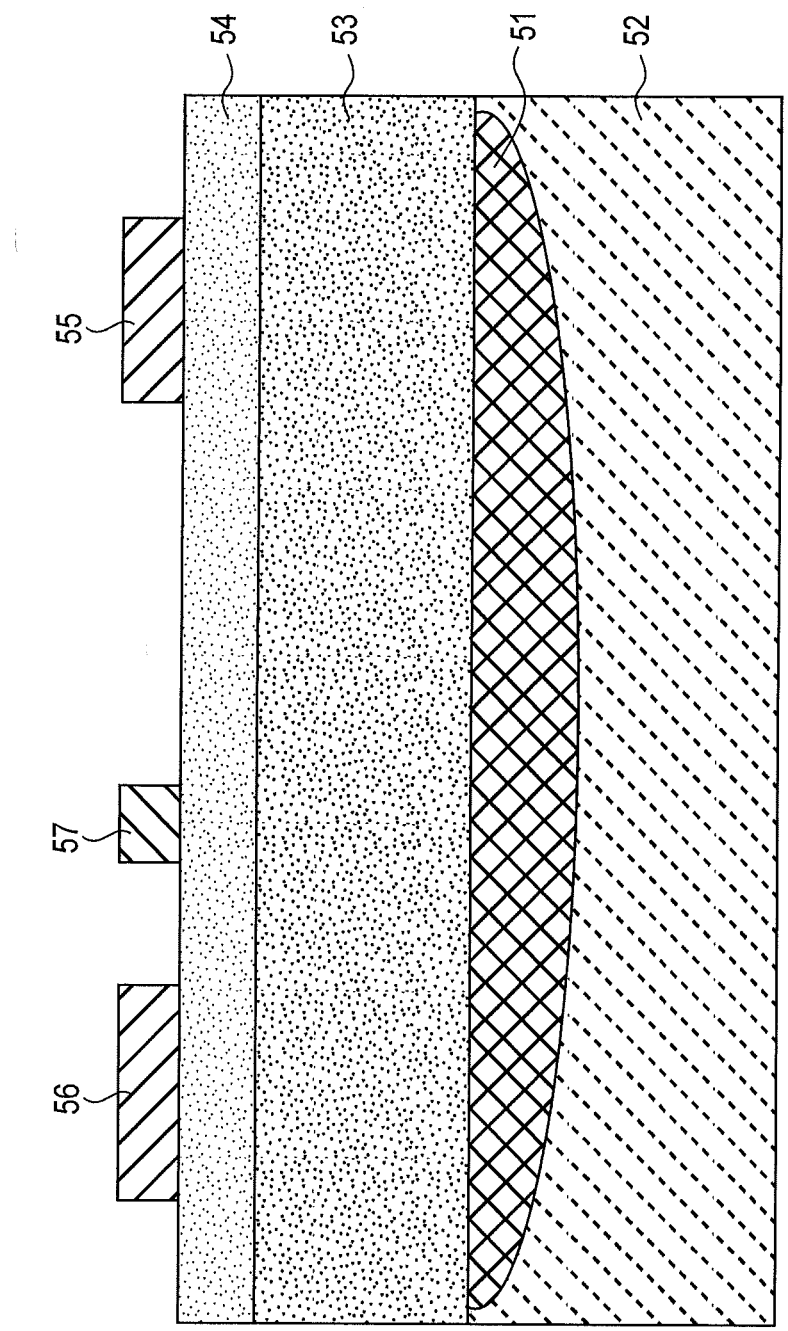

As shown in FIG. 4E, gate structure 57 and ohmic contacts 55 and 56 are then formed over the device layer 54 (shown as a single layer in FIG. 4E for purposes of clarity). Gate structure 57 can be formed, for example, by depositing p-type GaN material on a surface of device layer 54 (e.g., over electron absorption region 66b of FIG. 4D), etching the gate structure 57 from the p-type GaN material, and forming a refractory metal contact such as tantalum (Ta), titanium (Ti), titanium nitride (TiN), tungsten (W), or tungsten silicide ($WSi_2$) over the GaN material. It should be understood that other known methods and materials for providing a gate structure 57 can also be used. Ohmic contacts 55, 56 can be formed from any known ohmic contact metals, such as Ti and/or Al, along with a capping metal such as Ni, Au, Ti or TiN. The metal and gate layer are each preferably about 0.01 to about 1.0 µm in thickness, and then annealed at high temperature, such as 800 C for 60 seconds.

Figure 4F:
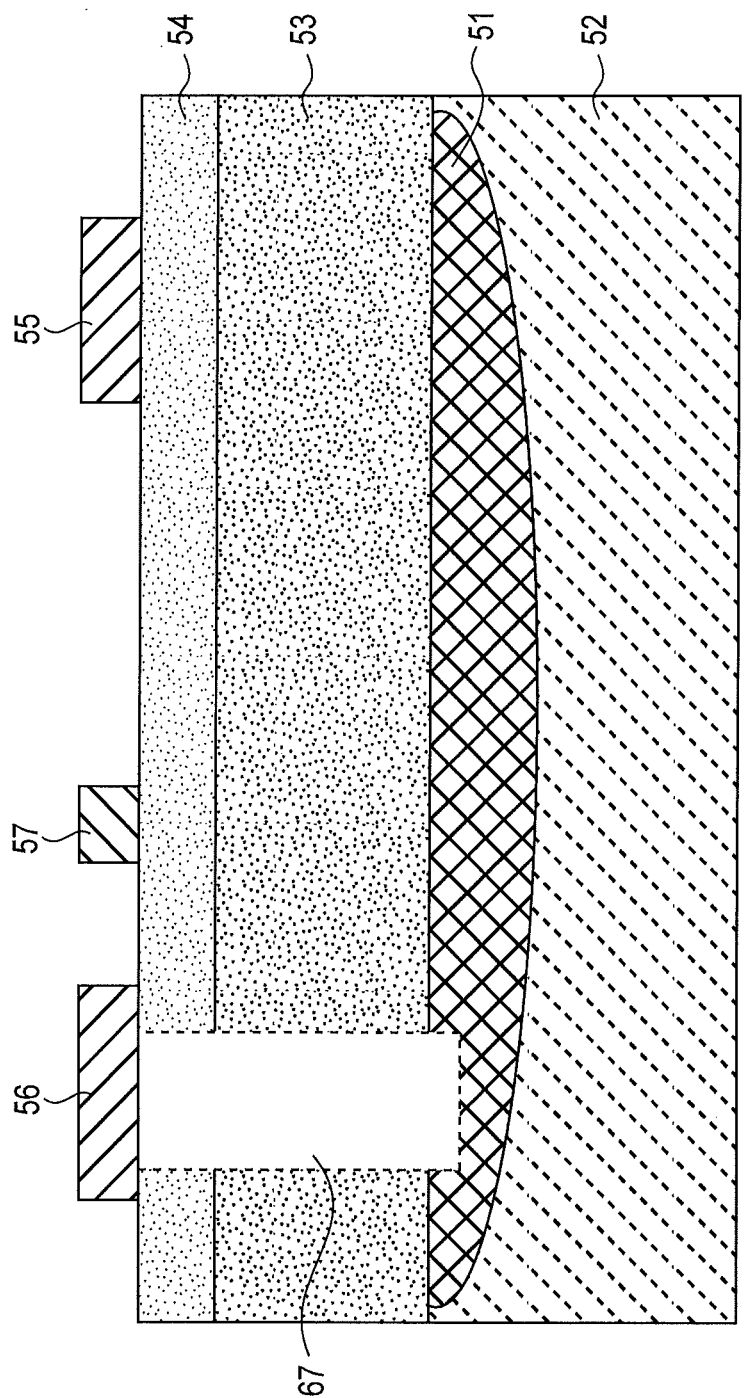

As shown in FIG. 4F, an opening 67 for the connection via 50 (FIG. 4G) may be fabricated by covering device layer 54 (shown as a single layer in FIG. 4F for purposes of clarity) with SiO2 and a photo-resist everywhere except at the site of the via 50, and then exposing the covered device to a high energy plasma in an etch chamber. The high energy plasma typically contains chlorine based gases, such as $BCl_3$ or $Cl_2$, and is generated through high frequency oscillating fields produced within the etch chamber. After etching through the device and buffer layers, the photo-resist is stripped off of device layer 54 using chemical strippers, oxygen plasma, or combinations of these techniques.

Figure 4G:
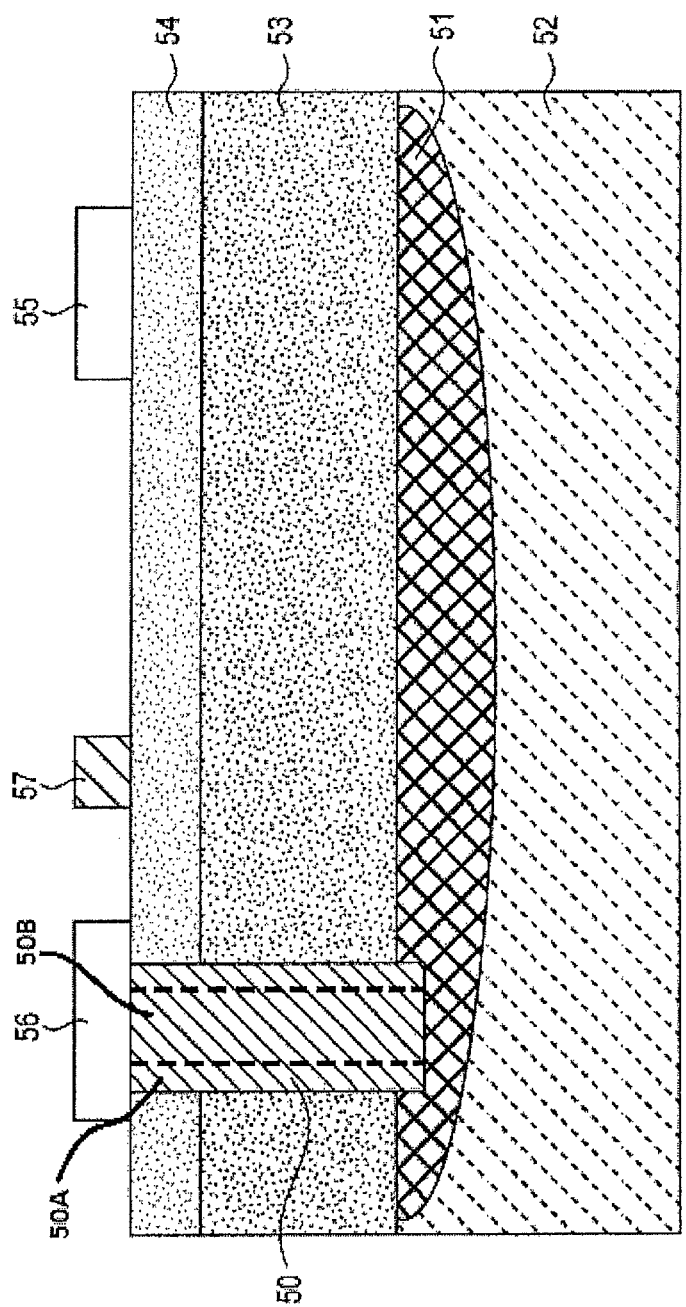

As shown in FIG. 4G, the conductive via 50 is then formed in opening 67 (FIG. 4F). TiN and Al can be deposited into the opening 67 to form the via 50, with the TiN material forming an outer layer 50A along the walls of opening 67 with a thickness in a range of about 100-200Å, and the Al material forming the interior 50B of via 50 having a thickness in a range of about 1-5 um. The TiN outer layer promotes adhesion of an Al material. Routing metal may then be deposited and etched to form connections between the via 50 and other connections, for example the source contact of a GaN FET.

Figure 5:
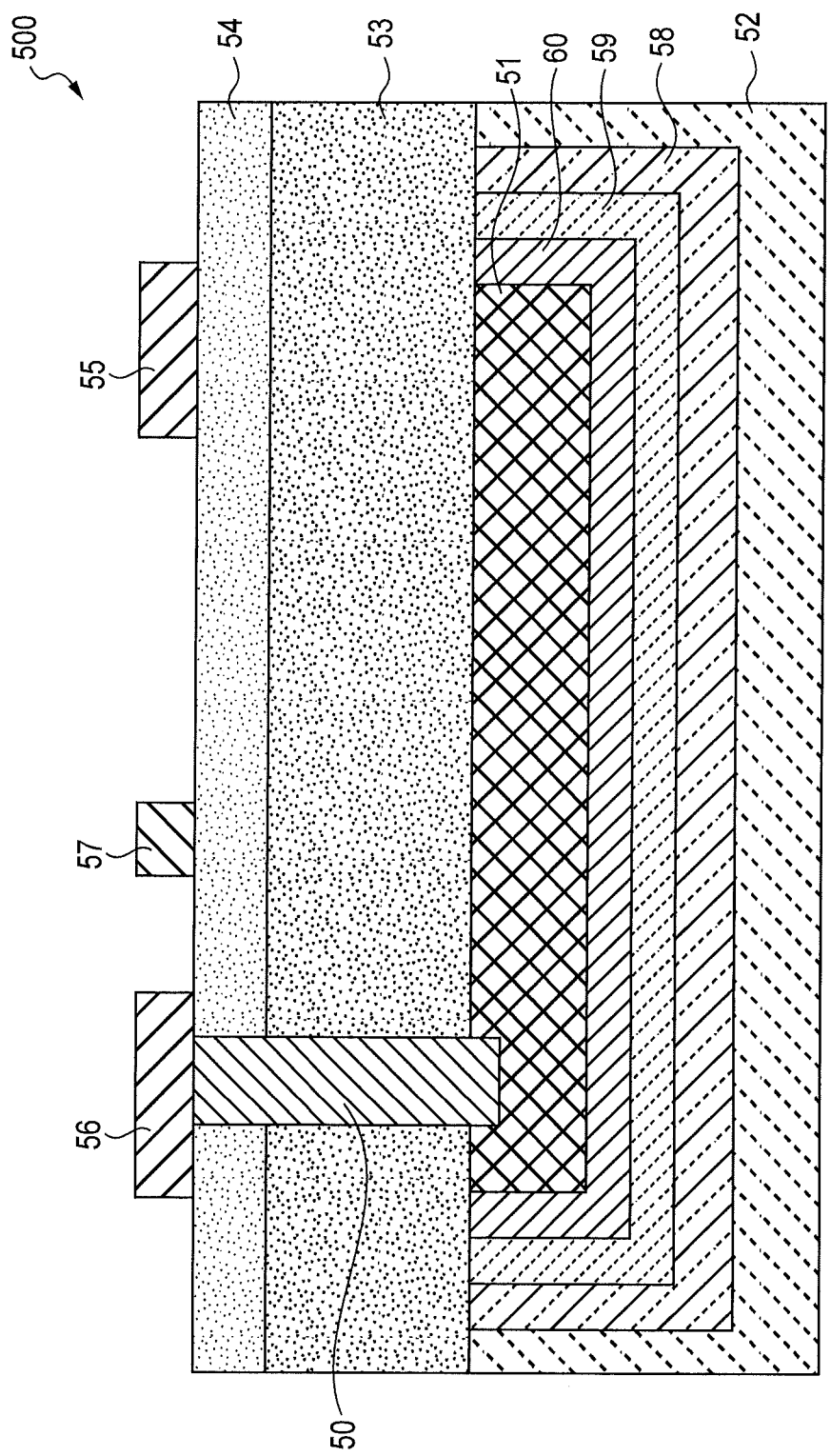
FIG. 5 illustrates a cross-sectional view of a transistor device formed according to a second embodiment.

Referring to FIG. 5, another semiconductor device 500 is shown, including substrate 52, buffer layers 53, device layer 54, gate structure 57, and source and drain contacts 55 and 56. Device 500 also includes connection via 50 and well 51. These elements can have similar parameters and can be formed through similar fabrication processes as those described for device 400 in FIG. 4.

Device 500 also includes a plurality of isolation layers 58, 59, 60 between well 51 and substrate 52. Isolation layers 58, 59, 60 form a diode structure along with substrate 52 and well 51. In particular, well 51 and substrate 52 may be materials of the same polarity (e.g., n or p), with isolation layers 58, 59, 60 forming a layer of opposite polarity. The diode structure formed by well 51, substrate 52, and isolation layers 58, 59, 60 provides isolation of the voltage in well 51 from substrate 52 for either polarity of voltage, and thus allows device 500 to be configured with either a positive or negative potential relative to the substrate 52. While three isolation layers are shown in FIG. 5, there may be greater or fewer isolation layers between well 51 and substrate 52, including a single isolation layer. In a preferred embodiment, at least one isolation layer 58, 59, 60 between well 51 and substrate 52 includes a minority carrier recombination dopant, e.g., platinum (Pt), to prevent latch-up of the diode structure.

Figure 6:
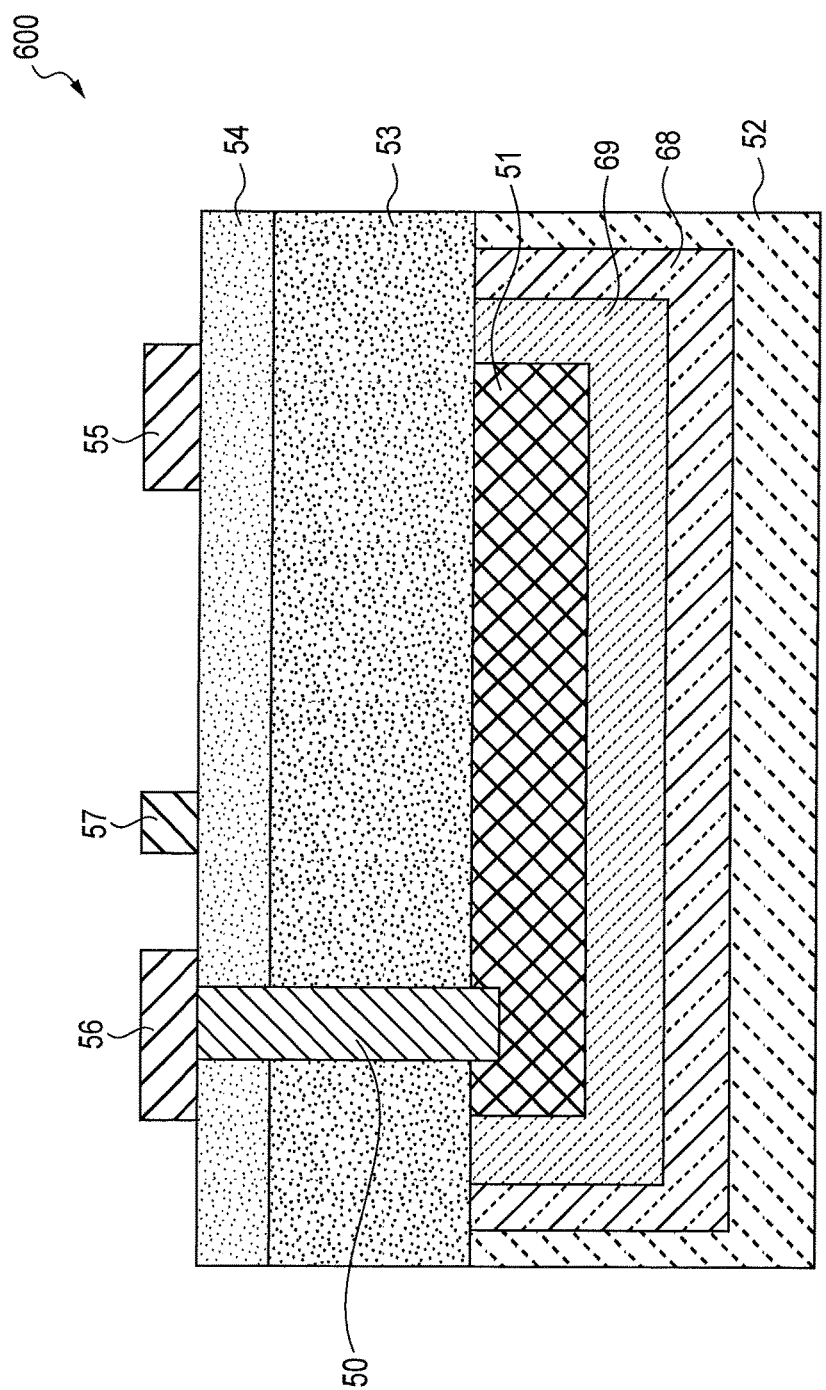
FIG. 6 illustrates a cross-sectional view of a transistor device formed according to a third embodiment.

Referring to FIG. 6, another semiconductor device 600 is shown, including substrate 52, buffer layers 53, device layer 54, gate structure 57, and source and drain contacts 55 and 56. Device 500 also includes connection via 50 and well 51. These elements can have similar parameters and be formed through similar fabrication processes as those described for device 400 in FIG. 4.

Device 600 includes oppositely-doped isolation layers 68 and 69, which form a thyristor along with well 51 and substrate 52. For example, well 51 may be an n-doped material, substrate 52 may be a p-doped material, isolation layer 68 may be an n-doped material, and isolation layer 69 may be a p-doped material, forming an n-p-n-p junction. The thyristor is characterized in that it has a blocking p-n junction in either direction. In a preferred embodiment, one of isolation layers 68 and 69 is a lightly doped region and will form the blocking region (i.e., either 68 or 69 are low doped regions, typically in a range of 1e14 to 1e 16 atoms/$cm^3$).

Device 600 provides for control of the back surface potential of substrate 52. The formed n-p-n-p or p-n-p-n junction also allows either polarity of voltage to be isolated, thus allowing the contacts 55, 56 and gate structure 57 to be held at either positive or negative potential relative to the substrate 52. In another embodiment, for example if it is desirable to have the well 51 and substrate 52 of the same type of doping (i.e., either both p or both n), then a third isolation region (not shown) can be added between substrate 51 and well 52.

Figure 7A:
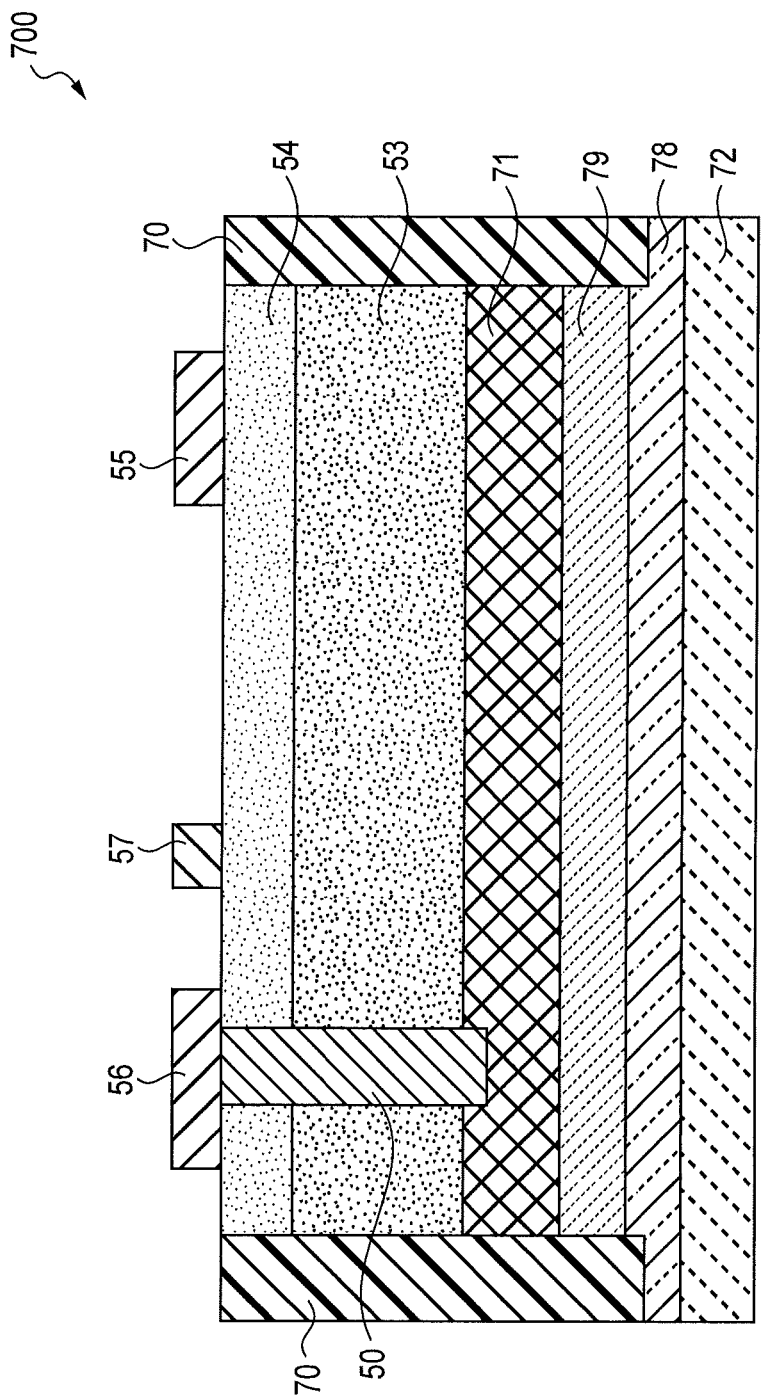
FIG. 7A illustrates a cross-sectional view of a transistor device formed according to a fourth embodiment of the present invention.

Referring to FIG. 7A, another semiconductor device 700 is shown, including buffer layers 53, device layer 54, gate structure 57, source and drain contacts 55 and 56, and connection via 50. These elements can have similar parameters and can be formed through similar fabrication processes as those described for device 400 in FIG. 4. Device 700 also includes a substrate 72, isolation layers 78 and 79, and well 71, which may consist of similar materials as substrate 52, isolation layers 68 and 69, and well 51, respectively, in device 600 (FIG. 6), but which are formed as flat layers. Device 700 also includes isolation regions 70 formed on respective sides of device 700, which provide isolation between neighboring semiconductor devices. As discussed further below, the configuration of device 700 is operationally similar to device 600, but provides for ease of fabrication. In one example, device 700 may be formed using silicon on insulator ("SOI") materials. For example, layer 78 may be formed of an insulating material, such as $SiO_2$, and layer 79 may be Si of the SOI substrate.

A method of fabricating device 700 is now described in connection with FIGS. 7B-7G. It should be recognized that the method of fabrication described herein may be easily applicable to individual semiconductor devices, or to multiple integrated semiconductor devices on a single wafer substrate.

Figure 7B:
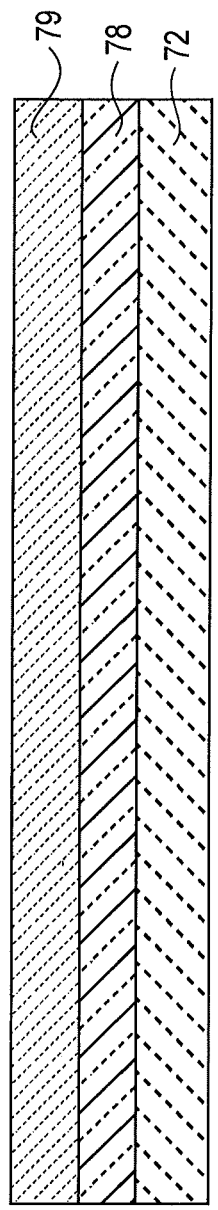
FIGS. 7B-7G illustrate a process for forming the transistor device of FIG. 7A.

In FIG. 7B, substrate 72 is provided and isolation layers 78 and 79 are formed as substantially flat layers of material over substrate 72, for example, through epitaxial deposition of Si or other appropriate materials, as described above, or a SOI substrate composed of a Si layer 79 over an $SiO_2$ layer 78 over a conductive substrate 72.

Figure 7C:
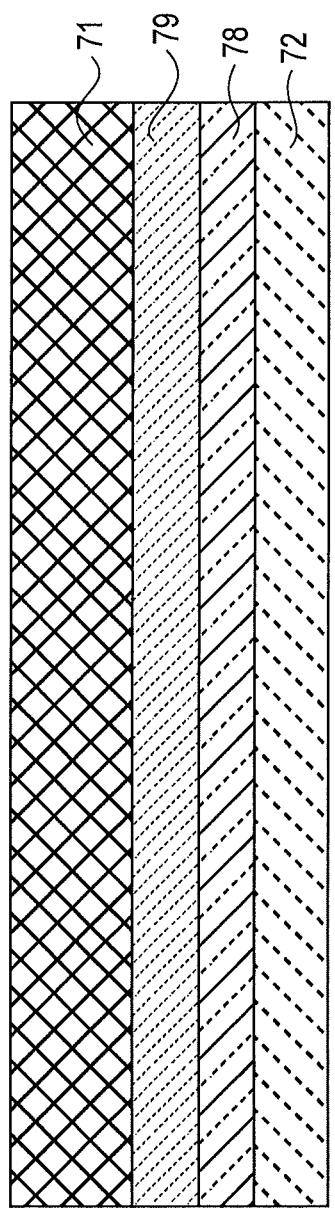

In FIG. 7C, well 71 is then formed over isolation layers 78, 79, for example, through epitaxial deposition of a boron doped Si material. Alternatively, if SOI substrates are used in device 700, formation of well 71 may not be required to isolate substrate 72.

Figure 7D:
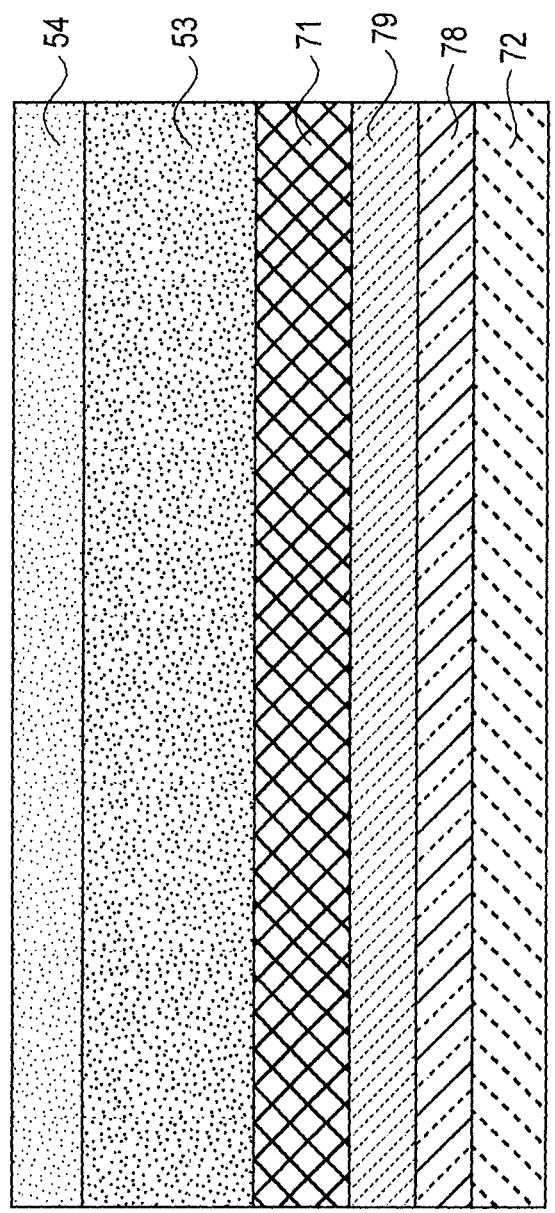

In FIG. 7D, buffer layers 53 and device layer 54 may then be formed epitaxially using GaN materials or other appropriate materials, in similar form as discussed above in connection with buffer layers 53 and device layer 54 of FIGS. 4C and 4D discussed above, respectively.

Figure 7E:
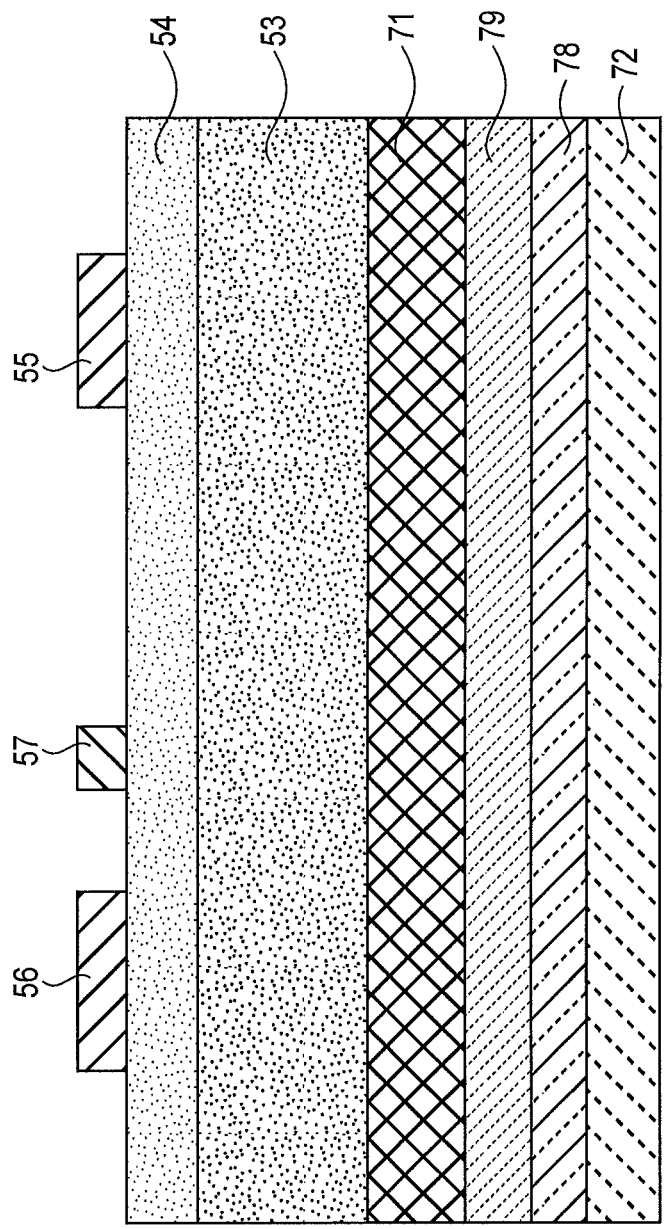

As shown in FIG. 7E, gate structure 57 and ohmic contacts 55 and 56 are then formed over the device layer 54 and connection via 50, in the manner described above in connection with FIG. 4E.

Figure 7F:
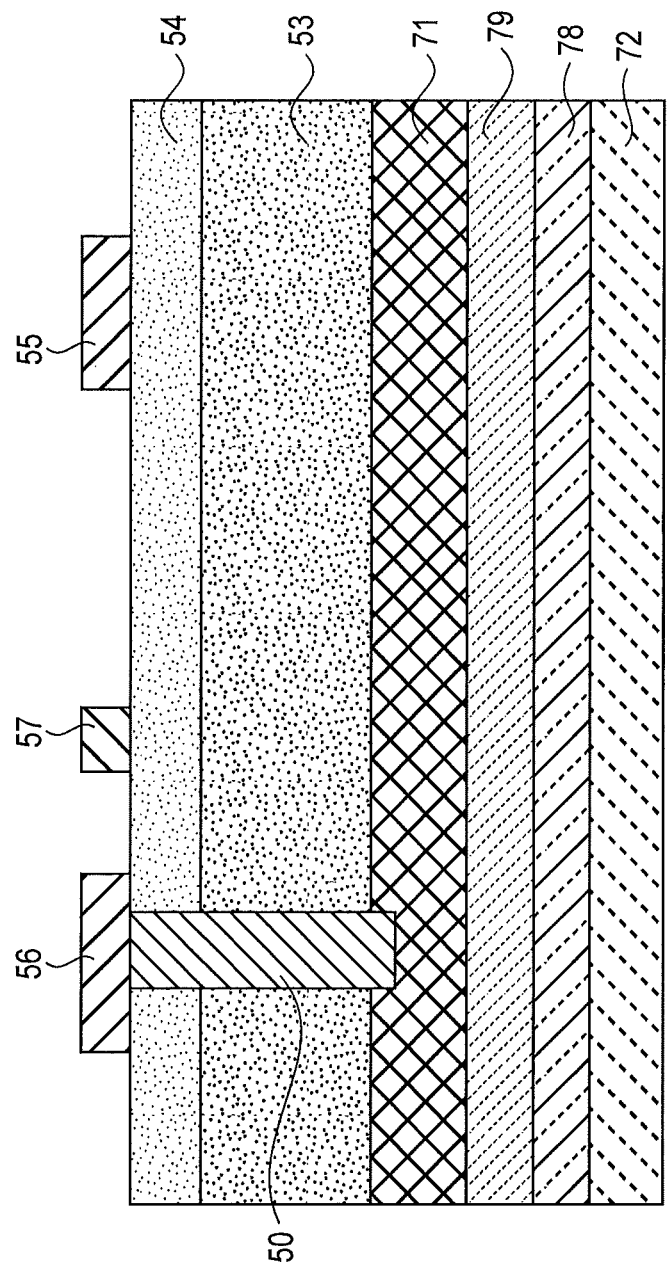

As shown in FIG. 7F, a connection via 50 is then formed through device layer 54 and buffer layers 53, and extending into well 71, in the manner described above in connection with FIGS. 4F and 4G. Alternatively, if SOI materials are used and a separate well 71 is not formed in device 700, via 50 may extend into Si layer 79 or $SiO_2$ layer 78.

Figure 7G:
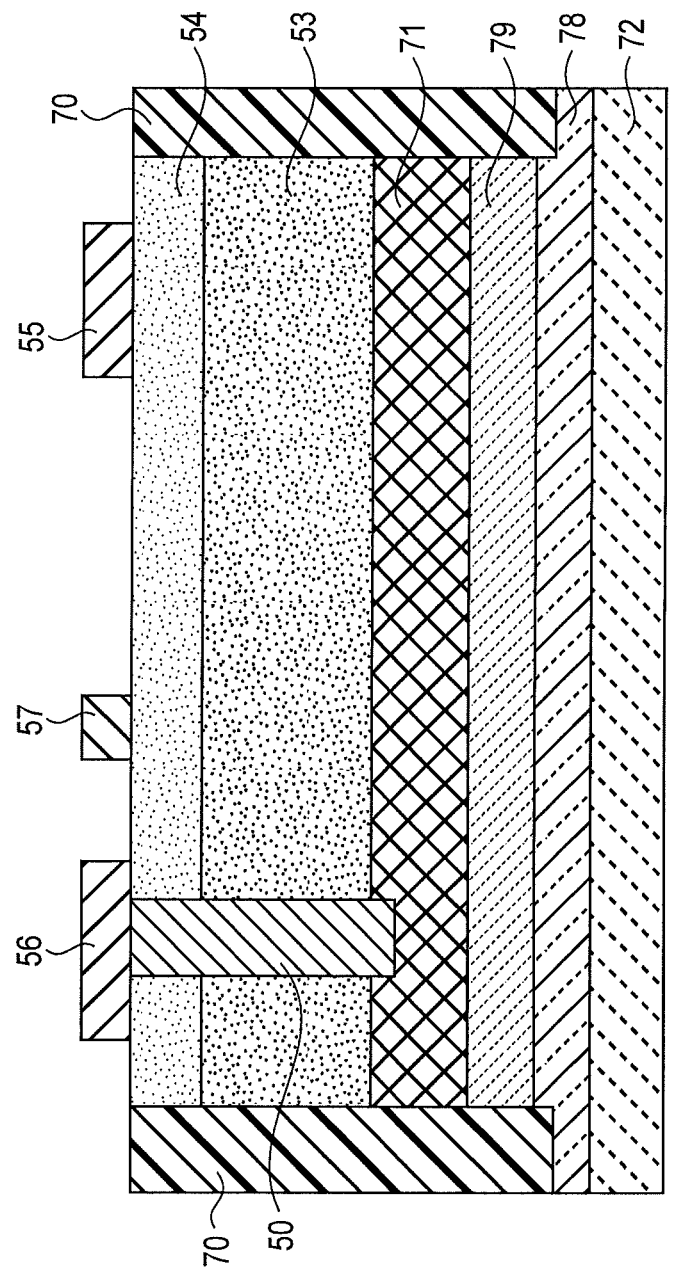

As shown in FIG. 7G, isolation regions 70 may then be formed in order to isolate well 71 of device 700 from neighboring devices. Isolation regions 70 can be formed by covering the portion of device layer 54 between the area where contacts 55 and 56 (FIG. 7E) will be formed with a photo-resist, and then etching down the exposed layers at least below well 71, and preferably to isolation layer 78. The etched regions can then be filled with oxide or other suitable isolating materials.

Figure 8:
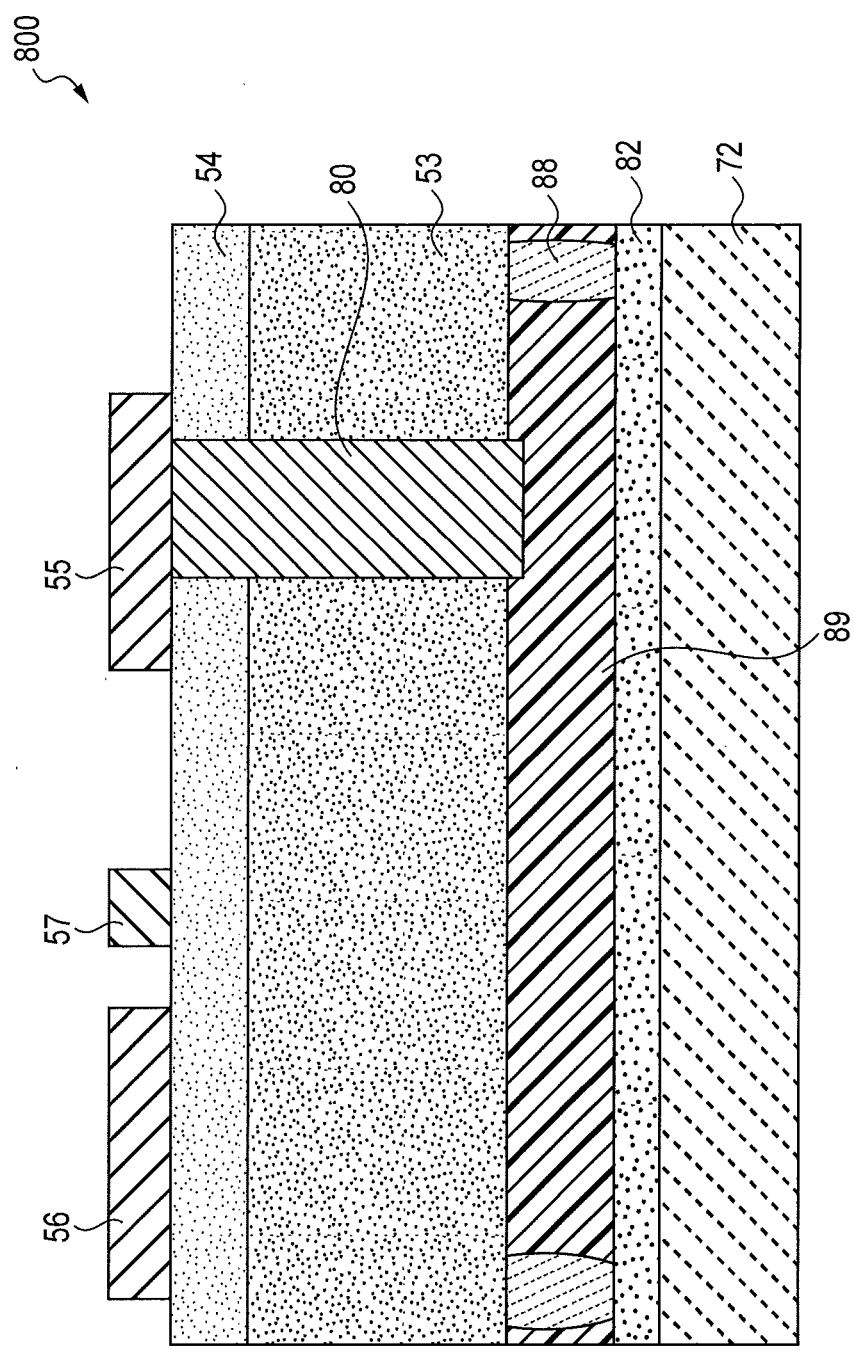
FIG. 8 illustrates a cross-sectional view of a transistor device formed according to a fifth embodiment.

Referring to FIG. 8, a semiconductor device 800 with a silicon on insulator ("SOI") configuration is shown. Device 800 includes buffer layers 53, device layer 54, source and drain contacts 55 and 56, and gate structure 57. These elements may have similar parameters and be formed through similar fabrication processes as those described for device 600 in FIG. 6. Device 700 also includes a substrate 72, which may be formed as a substantially flat layer, or in an otherwise suitable form.

Device 800 also includes an SOI layer 89 and a buried oxide layer 82 between SOI layer 89 and substrate 72. SOI layer 89 may be, for example, composed of a doped Si material with a concentration in a range of approximately 1e14 to 1e19 atoms/$cm^3$. The SOI layer 89 may have either a p or n-type doping, depending upon the desired configuration of device 800. Device 800 includes a connection via 80 electrically tying one or more of the device contacts (e.g., as shown, contact 55) to the SOI layer 89. Buried oxide layer 82 electrically isolates substrate 72 from SOI layer 89.

As shown in FIG. 8, isolation implants 88 may be used to isolate respective SOI regions 89 of neighboring devices. Isolation implants 88 are formed with oppositely-doped material to that used to form SOI layer 89, thus preventing conduction across respective SOI regions 89 of neighboring integrated devices. While isolation implants 88, if thick enough, may be capable of providing electrical isolation to SOI layer 89 in both directions, there is a possibility that isolation implants 88, which would have an opposite polarity to SOI layer 89, could form an n-p-n diode with the SOI layer 89. This could result in the n-p-n diode, having an open base, conducting between neighboring SOI regions. Accordingly, in another embodiment, a minority carrier lifetime reducing dopant, such as Pt, or any other suitable dopant known in the art, may be added to isolation implants 88.

Figure 9A:
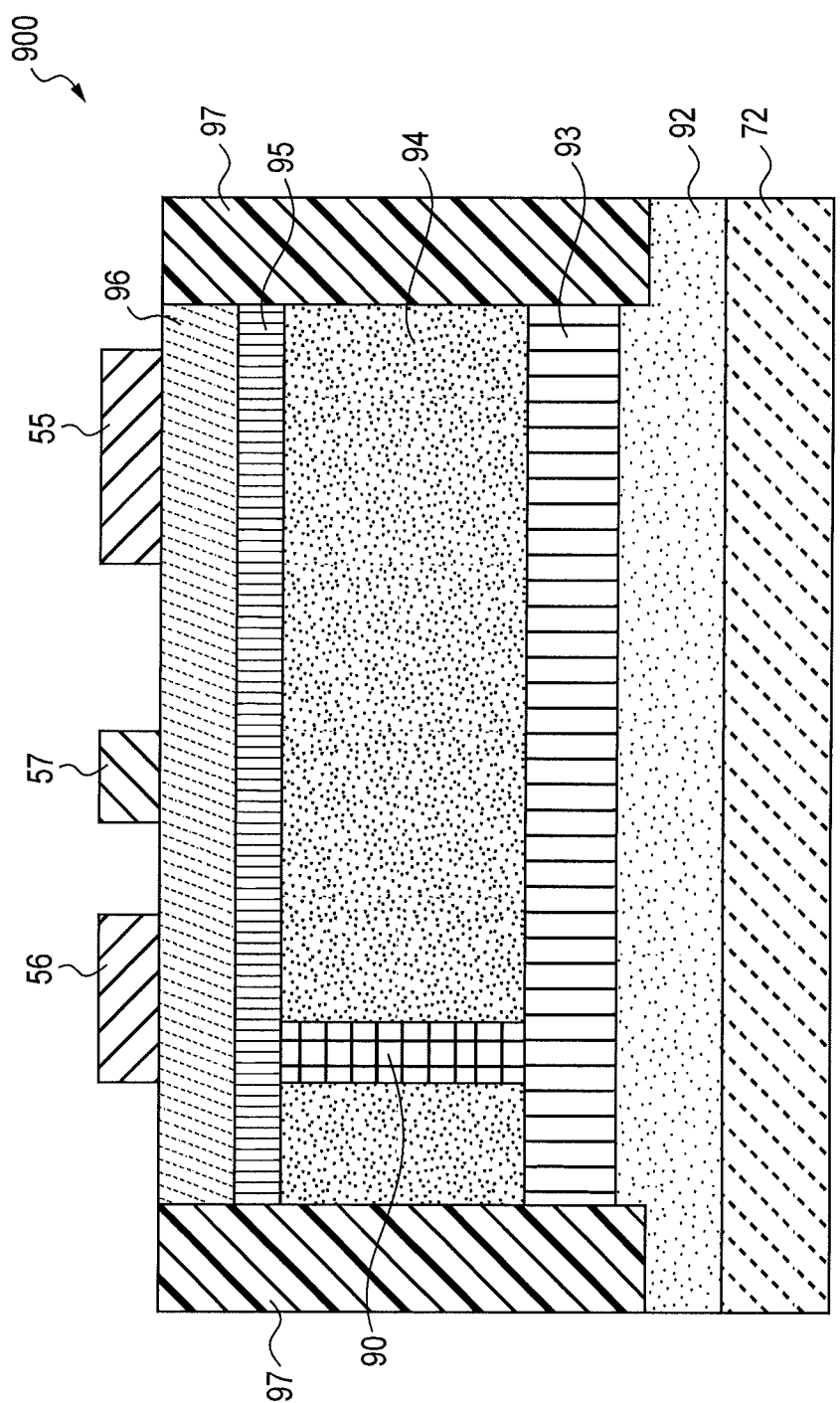
FIGS. 9A-C illustrates a cross-sectional view of a transistor device formed according to a sixth embodiment.

Referring to FIG. 9A, another semiconductor device 900, including epitaxially-based substrate isolation, is shown. Device 900 includes a substrate 72 and buffer layers 94, which may be formed of similar materials as substrate 72 and buffer layers 53 in device 700 (FIG. 7A). For example, buffer layers 94 may be composed of AlN material having a thickness in the range of 0.1-0.5 μm, one or more layers of AlGaN having a thickness 0.1 to 2 μm, and GaN having a thickness of 0.01 to 5 μm. Substrate 72 may be composed of one or more Si, SiC, or GaAs-based materials.

Device 900 includes one or more substrate isolation layers 92 formed on substrate 72. Substrate isolation layer 92 may be formed of a material such as AlN, or a high Al-content AlGaN material, or other suitable material. The preferred thickness of substrate isolation layers 92 depends on the voltage rating desired for device 900, and may preferably be in a range of 0.5 to 1 μm per every 100 V desired to be blocked.

Device 900 also includes a current conducting region 95 providing a primary current conducting channel, and a barrier layer 96 above the current conducting region 95. Current conducting region 95 may be composed of GaN, InGaN, or other suitable materials known in the art, and preferably has a thickness in a range of about 0.01 to about 0.1 μm. Barrier layer 96 may be composed of AlGaN where the Al to Ga ratio is preferably in a range of about 0.1 to about 1, with a thickness preferably in the range of about 0.01 to 0.03 μm, or other suitable materials known in the art. Although not shown for clarity in explaining other aspects of the embodiment, it should be understood that device 900 may also include contact regions 15 (FIG. 1) under one or both of contacts 55 and 56, which may be composed of AlGaN, Al and titanium (Ti) that may have Si, preferably having a thickness in the range of about 0.01 to about 0.03 μm, or other suitable materials known in the art.

Device 900 also includes a conductive well 93 that serves as a parallel current conducting region, forming a parallel channel between substrate isolation layers 92 and buffer layers 94. Parallel current conducting region 93 may be formed of an n-type GaN material with Si doping in a range of 1e17 to 1e19 Si/$cm^3$. In another embodiment, parallel current conducting region 93 may be formed with an AlGaN material on top of a GaN material, similar to the manner in which current conducting region 95 is formed. Due to the Piezo effect in nitride materials, a 2DEG is formed at the bottom of each AlGaN layer. In such an embodiment, the AlGaN material preferably has a thickness in a range of about 0.02 to 0.03 µm, and a concentration of Al in a range of about 20% to 30%. The GaN material preferably has a thickness of approximately 0.1 µm.

Device 900 also includes a channel connection 90 in buffer layers 94 between current conducting region 95 and parallel current conducting region 93. Channel connection 90 may be formed by implanting Si atoms into buffer layers 94, preferably with a density in a range of about 1e17 to 1e19 atoms/cm$^3$. In other embodiments, channel connection 90 may be composed of tungsten or aluminum with titanium nitride. Device 900 may optionally also include isolation regions 97, which may be composed of similar materials to and formed in a similar manner as isolation regions 70 of device 700 (FIG. 7), or through other suitable materials and processes. For example, isolation regions 97 may be formed by etching the external portions of device 900 to a depth at least below parallel current conducting region 93, and preferably into substrate isolation layers 92, and filling the etched areas with oxide.

Figure 9B:
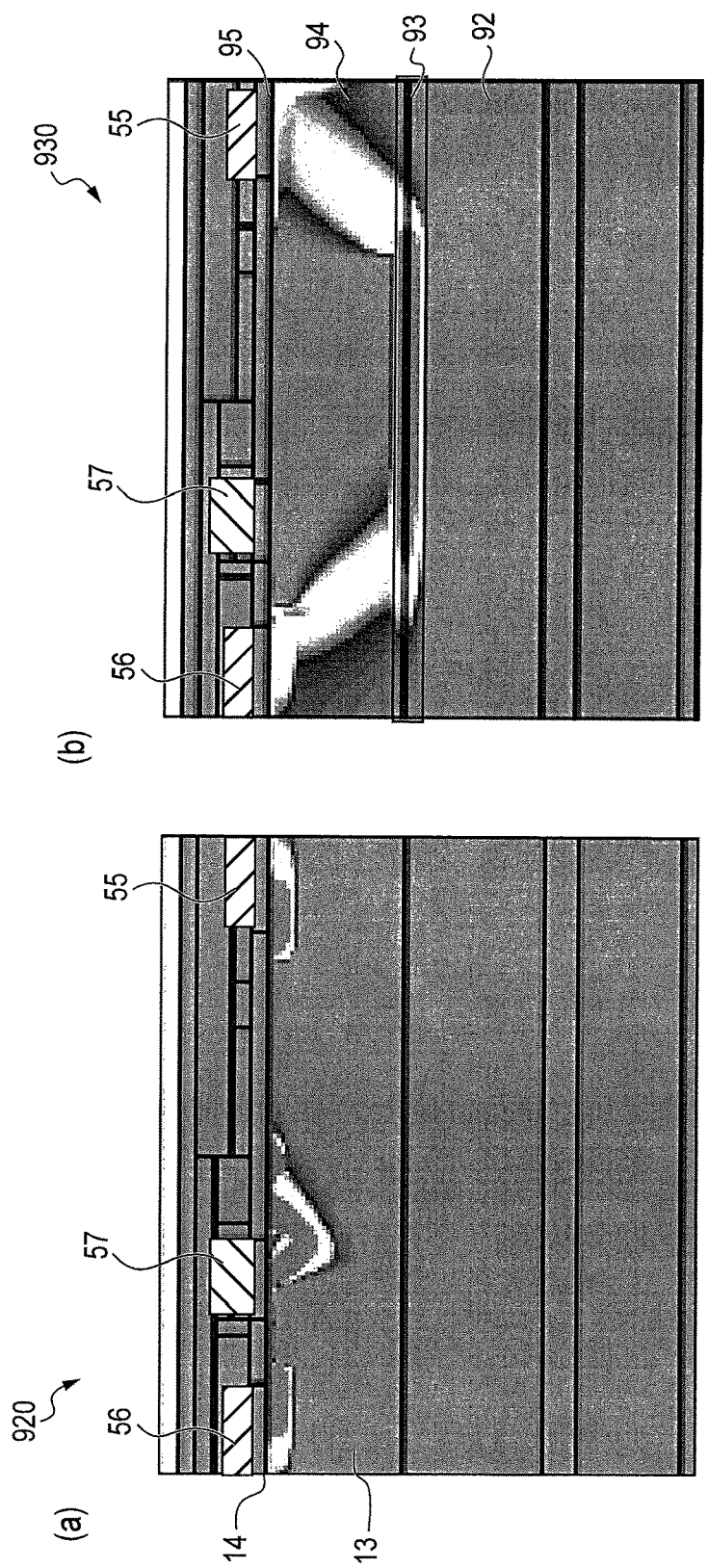

FIG. 9B shows a comparison of simulated conduction paths between a conventional semiconductor device (e.g., device 100 of FIG. 1) shown in simulation 920, and a semiconductor device 900 shown in simulation 930. Simulation 920 illustrates a conduction path of a semiconductor device with only a single current conducting region 14 providing a single channel, formed above buffer layers 13. Simulation 930 illustrates a conduction path of a semiconductor device, such as semiconductor device 900, having a primary current conducting region 95, buffer layers 94, a parallel current conducting region 93 forming a parallel channel, and a substrate isolation layer 92.

Figure 9C:
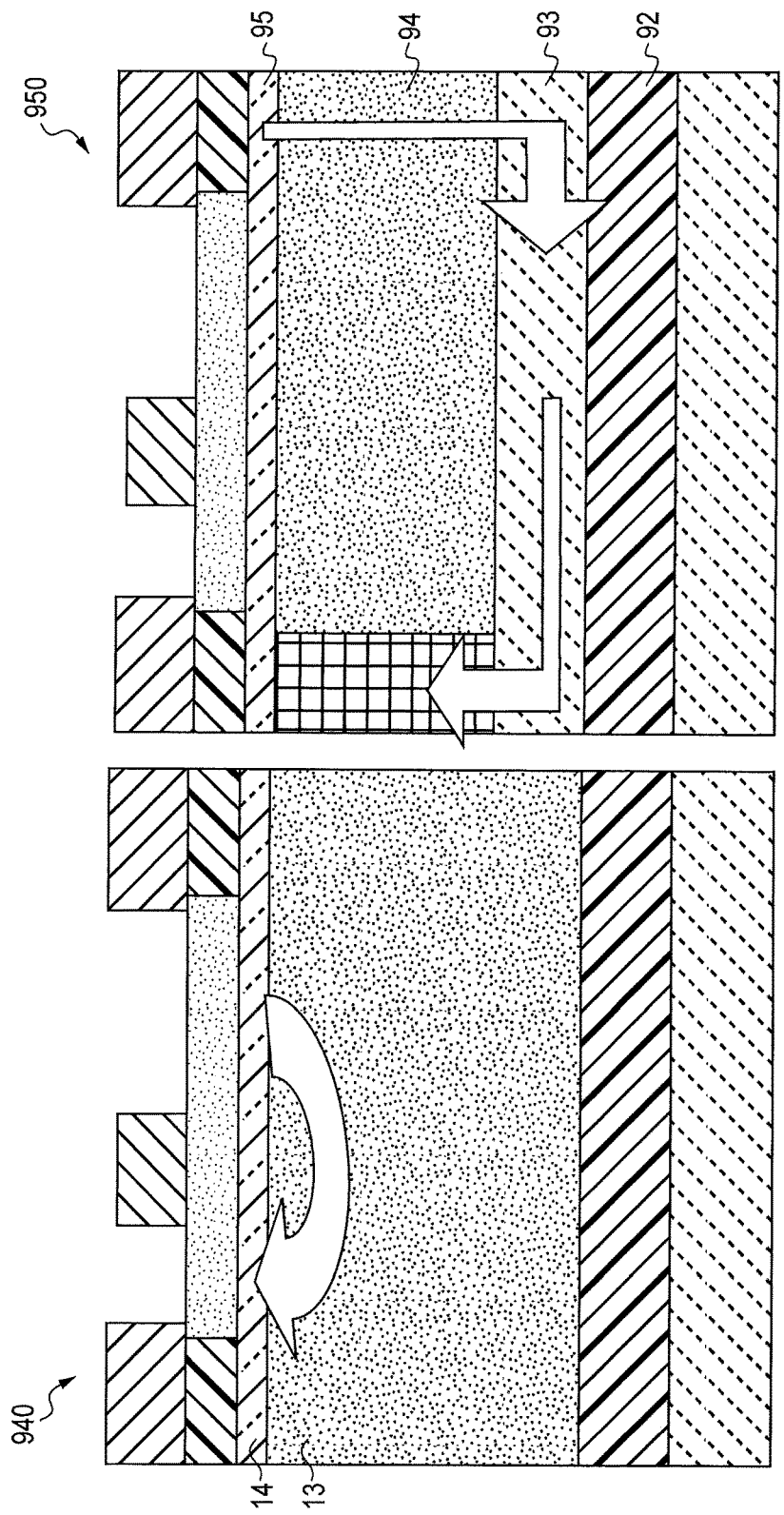

FIG. 9C depicts, in graphic form, a comparison of the current conduction paths 940, 950 in simulations 920, 930, respectively. The current conduction path 940 in FIG. 9C shows current flowing through a single primary channel in current conducting region 14, while the current conduction path 950 shows current flowing from a primary channel in a first primary current conducting region 95 across a buffer layer 94 and to a parallel channel in a parallel current conducting region 93.

Figure 10:
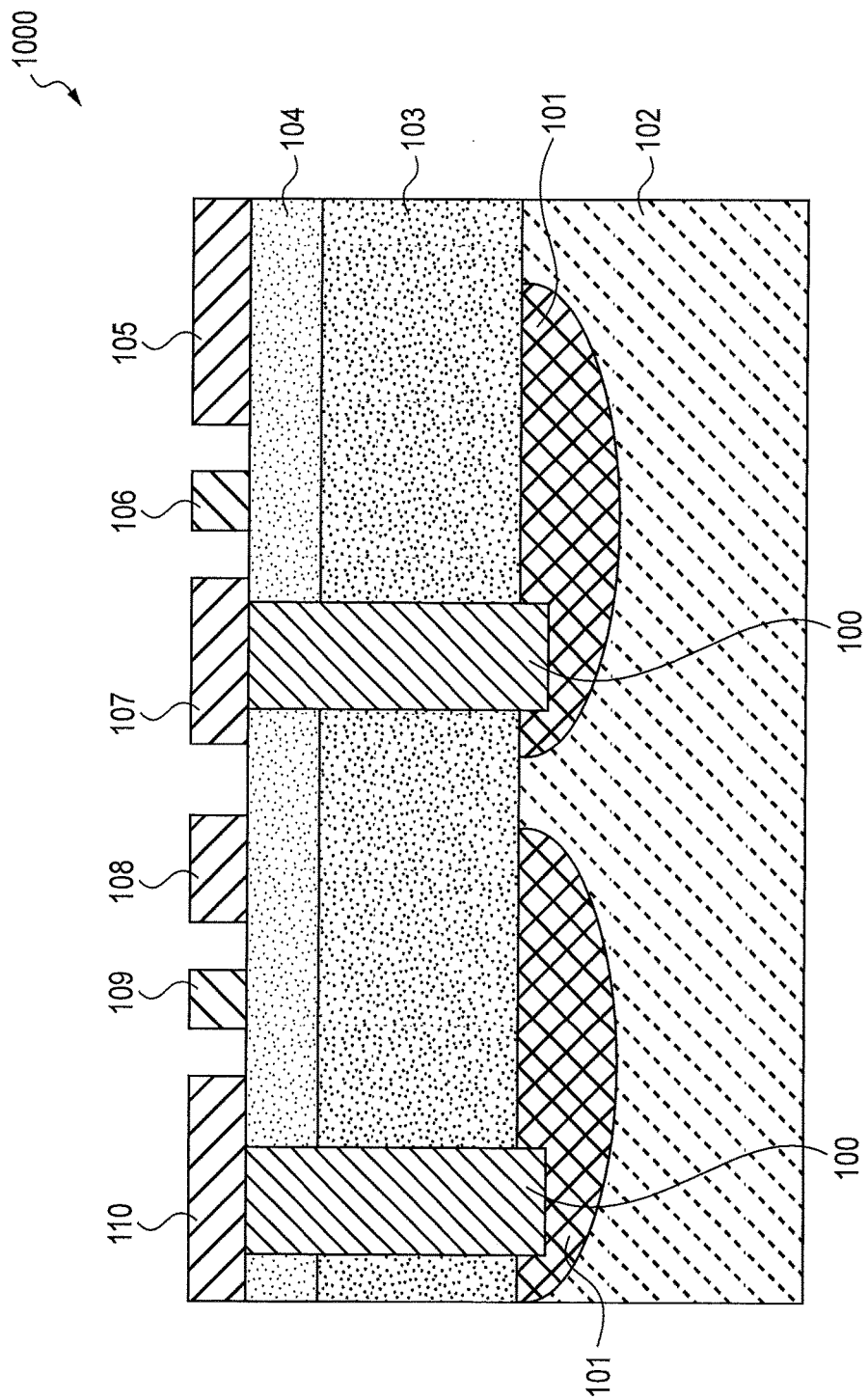
FIG. 10 illustrates a cross-sectional view of an integrated semiconductor device, in accordance with embodiments described herein.

Referring to FIG. 10, an integrated semiconductor device 1000 is shown. Integrated device 1000 includes two neighboring semiconductor devices integrated on a single substrate 102: a first device controlled by contacts 105, 107 and gate 106; and a second device controlled by contacts 108, 110, and gate 109. The first and second semiconductor devices may be, for example, GaN semiconductor devices similar to semiconductor device 400 described above in connection with FIG. 4A. For example, in device 1000, substrate 102 may be composed of one or more Si, SiC, GaAs, and/or sapphire-based materials. Buffer layers 103 may be composed of AlN material having a thickness in the range of 0.1 to 0.5 µm, one or more layers of AlGaN having a thickness in a range of 0.1 to 2 µm, and GaN having a thickness in the range of 0.01 to 5 µm. Device layer 104 may be composed of AlGaN having a thickness in the range of 0.01 to 0.03 µm, and having an Al concentration within a range of approximately 15-30%. Contacts 105, 107, 108, 110 may be composed of a mixture of Ti and Al. Gate structures 106, 109 may be composed of p-type GaN and TiN or Ni and Au. It should be understood that the respective components for each semiconductor device within integrated device 1000 need not have identical, or even similar, characteristics, although semiconductor devices having similar characteristics may provide for ease in fabrication and other benefits.

Integrated device 1000 includes respective well regions 101 beneath each semiconductor device, and respective connection vias 100 leading from contacts 110, 107 of each semiconductor device to the respective well regions 101. As discussed above, substrate 102 can be an n-type substrate, and implanted well 101 can be a p-type well, providing a device that operates at a negative potential in relation to the substrate 102. In another embodiment, substrate 102 can be a p-type substrate, and well region 101 can be an n-type well, providing a device that operates at a positive potential in relation to the substrate 102. Via 100 can be composed of Al material having a thickness in the range of 1 to 5 µm and a thin layer of TiN having a thickness in the range of 0.01 to 0.1 µm, as well as SiO2 to completely fill the via 100.

In integrated device 1000, via 100 provides a very low inductance and low resistance path from the back side of the semiconductor device to a front side connection of the device (e.g., as shown, contacts 107, 110). These properties can be beneficial for high frequency operation. The presence of wells 101 below the device and buffer layers 104, 103 at the back side of the device 1000 provides these properties, while also isolating the back surface potential from the substrate potential. Each respective semiconductor device in integrated device 1000 thus has an independently controlled back surface potential which is isolated from the substrate potential, as well as from the potential at respective gate, source, and drain contacts 105-110, providing completely independent semiconductor devices.

Figure 11:
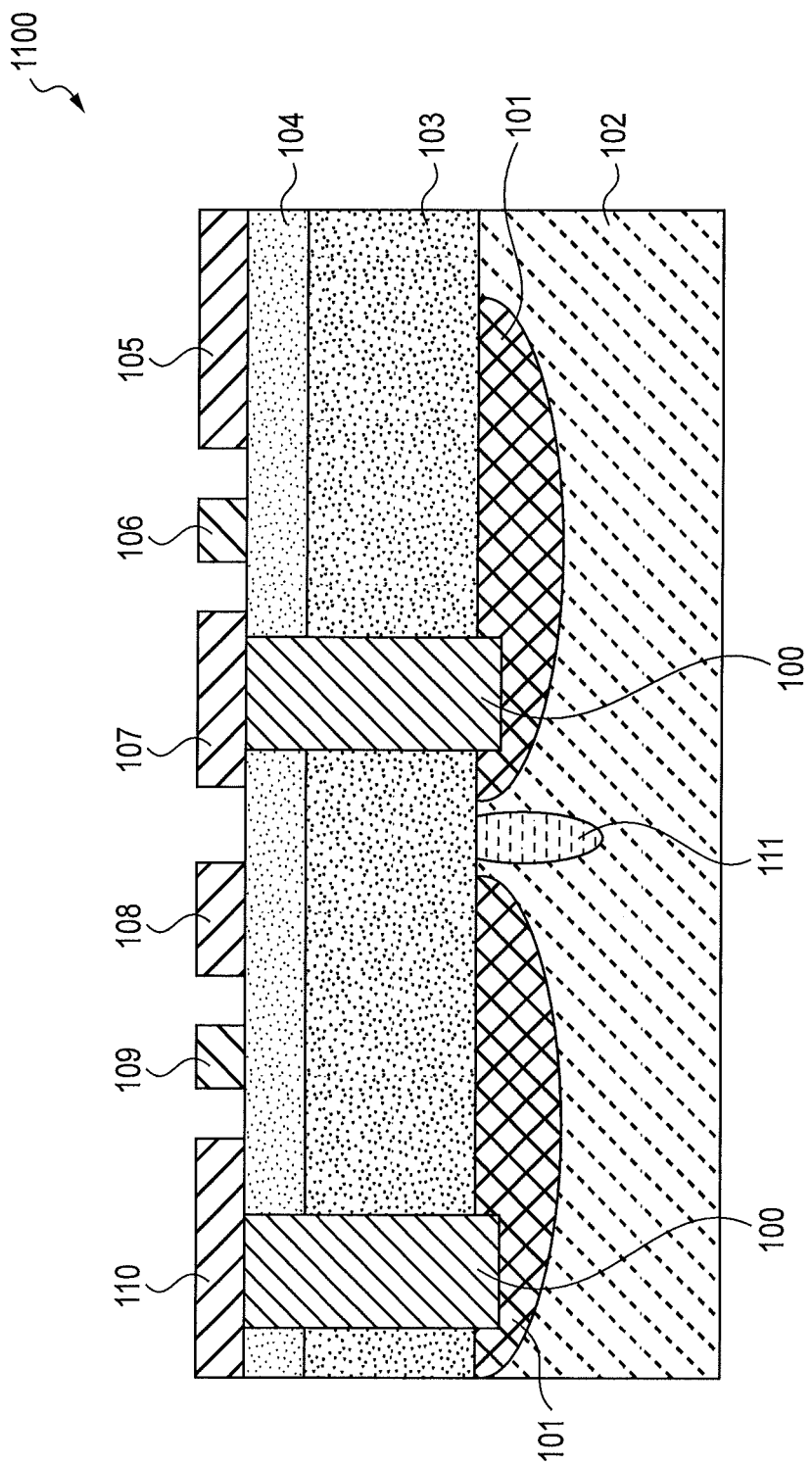
FIG. 11 illustrates a cross-sectional view of an integrated semiconductor device, in accordance with embodiments described herein.

While integrated device 1000 provides significant benefits, one potential problem with conductive wells 101 is that neighboring wells may create an n-p-n or p-n-p junction that could cause an undesirable short circuit condition, known as latch up, between the wells 101. Referring to FIG. 11, another integrated device 1100 includes elements similar to those discussed above with regard to device 1000 (FIG. 10), and also includes a suppression region 111 between respective wells 101 of the neighboring semiconductor devices in integrated device 1100. Suppression region 111 may be configured as a minority carrier recombination region, and may be formed using Pt or other appropriate recombination center materials. Suppression region 111 suppresses latch-up condition between neighboring respective wells 101.

Figure 12:
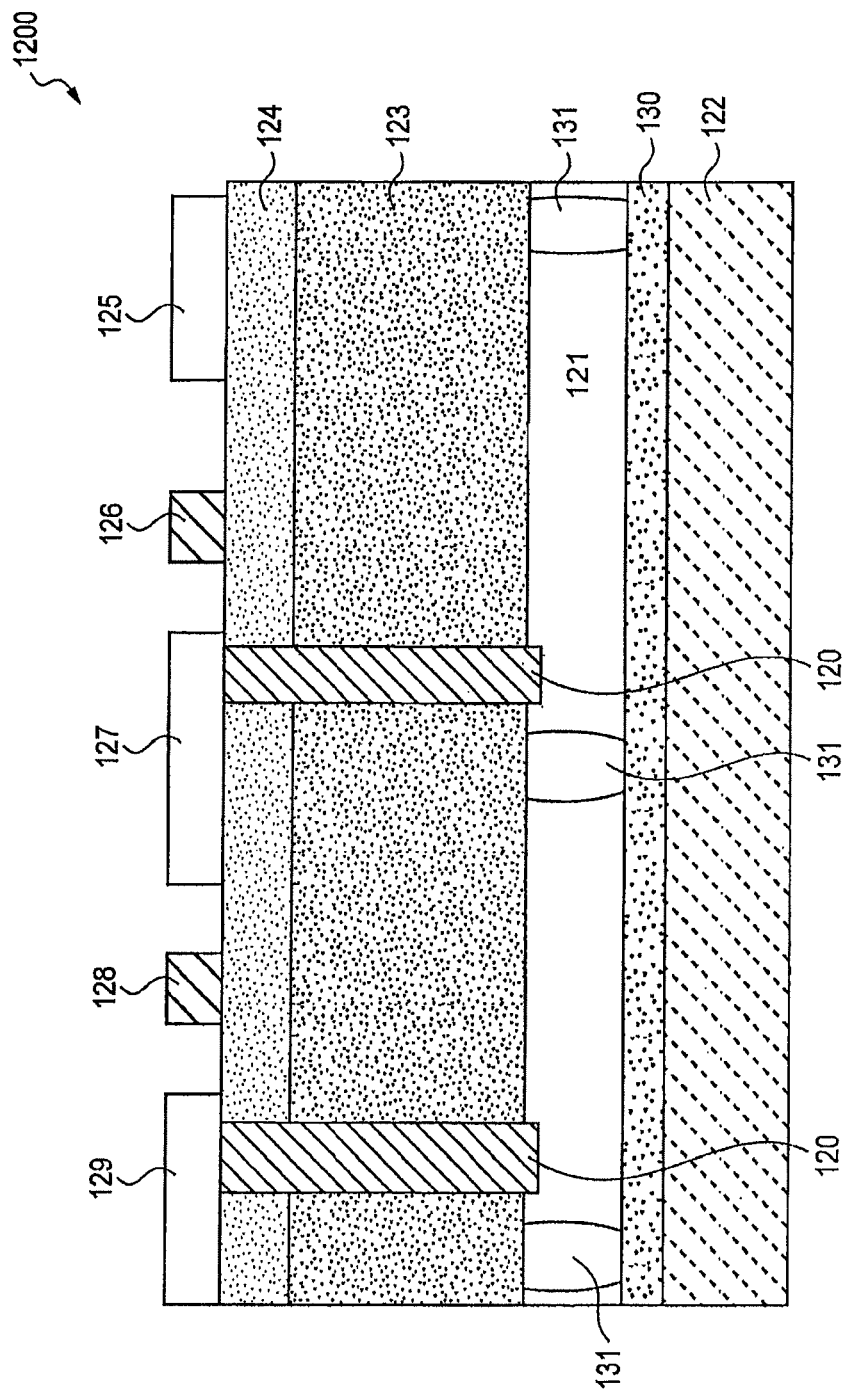
FIG. 12 illustrates a cross-sectional view of an integrated semiconductor device, in accordance with embodiments described herein.

Referring to FIG. 12, integrated semiconductor device 1200 having a silicon on insulator ("SOI") configuration is shown. Device 1200 includes buffer layers 123 and device layer 124. These elements may have similar parameters and be formed through similar fabrication processes as those described for device 800 (FIG. 8), described above. Device 1200 also includes a substrate 122, an SOI layer 121, and a buried oxide layer 130 between buffer layers 123 and substrate 122, which may have similar parameters and be formed through similar fabrication processes as those described for device 800 (FIG. 8), described above. Device 1200 includes connection vias 120 which connect electrical contacts (e.g., as shown, source contacts 129, 127) to the SOI layer 121. Buried oxide layer 130 electrically isolates substrate 122 from the SOI layer, making the substrate voltage independent of the SOI layer voltage.

Device 1200 includes source and drain contacts 125, 127, 129, and gate structures 126, 128. In this embodiment, the two neighboring semiconductor devices in integrated devices 1200 share a common contact 127, which serves as a drain to source contact 129 and a source to drain contact 125, forming a half-bridge circuit device.

Isolation implants 131 are used to isolate regions of SOI layer 121 corresponding to respective transistor devices in integrated device 1200. Isolation implants 131 are formed with oppositely-doped material to that used to form SOI layer 121, thus preventing conduction across SOI regions of neighboring integrated devices. As discussed above with regard to device 800, in other embodiments, a minority carrier lifetime reducing dopant, such as Pt, or any other suitable dopant known in the art, may be added to isolation implants 131.

Figure 13:
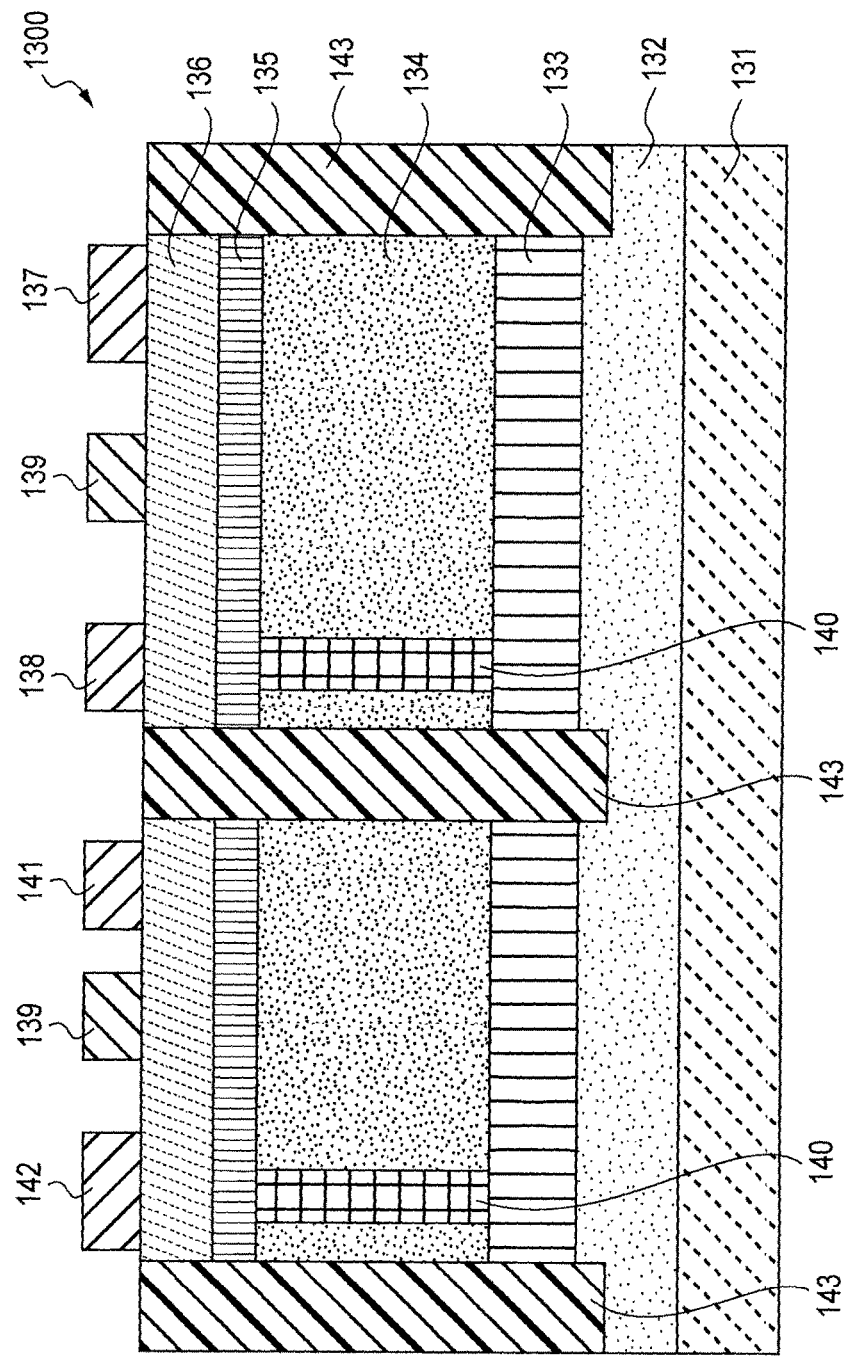
FIG. 13 illustrates a cross-sectional view of an integrated semiconductor device, in accordance with embodiments described herein.

Referring to FIG. 13, an integrated semiconductor device 1300 in a parallel channel configuration is shown. Device 1300 includes multiple semiconductor devices, such as semiconductor device 900 (FIG. 9). Integrated device 1300 includes a first current conducting region 135 providing respective primary channels for each respective semiconductor device in integrated device 1300, and a barrier layer 136 above each primary channel 135 and below contacts 137, 138, 141, 142. These elements may include similar characteristics and can be formed through similar processes as the elements in device 900 (FIG. 9) described above.

Integrated device 1300 also includes a conductive well 133 forming respective parallel conducting channels for each device between substrate isolation layers 132 and buffer layers 134. Parallel current conducting regions 133 may be formed of an n-type GaN material with Si doping or with an AlGaN material on top of a GaN material, or through any other appropriate semiconductor material, as discussed above with regard to device 900 (FIG. 9). Respective channel connections 140 in buffer layers 134 are formed between current conducting regions 135 and parallel current conducting regions 133. Channel connections 140 may be formed by selectively implanting Si atoms into buffer layers 134, preferably with a density in a range of about 1e17 to 1e19 atoms/cm$^3$, and more preferably at a density of approximately 1e18 atoms/cm$^3$, and annealed at 1150° C. for two hours. Preferably, current conducting regions 135, parallel current conducting regions 133, and channel connections 140 are all n-type material. Respective current conducting regions 135 and parallel current conducting regions 133 are electrically connected through channel connections 140.

Integrated device 1300 also includes one or more substrate isolation regions 132 formed on substrate 131. Substrate isolation layers 132 may be formed of a material such as AlN, or a high Al-content AlGaN material, or other suitable material. As discussed above with regard to device 900 (FIG. 9), the preferred thickness of substrate isolation layers 132 may be varied depending upon the voltage rating desired for integrated device 1300.

Device 1300 may optionally also include isolation regions 143, which may be composed of similar materials to and formed in a similar manner as isolation regions 70 of device 700 (FIG. 7), or through other suitable materials and processes. For example, isolation regions 143 may be formed by etching the indicated portions of device 1300 to a depth at least below parallel current conducting region 133, and preferably into substrate isolation layers 132, and filling the etched areas with oxide. Channel connections 140 provide a very low inductance and low resistance path from the back side of the semiconductor device to a front side connection of the device (e.g., as shown, contacts 142, 138), while the presence of isolation regions 143 between neighboring devices and substrate isolation layers 132 at the back side of the device allows each respective semiconductor device to have an independently controlled back surface potential which is isolated from the substrate potential and from the potential of channels of neighboring devices.

Figure 14:
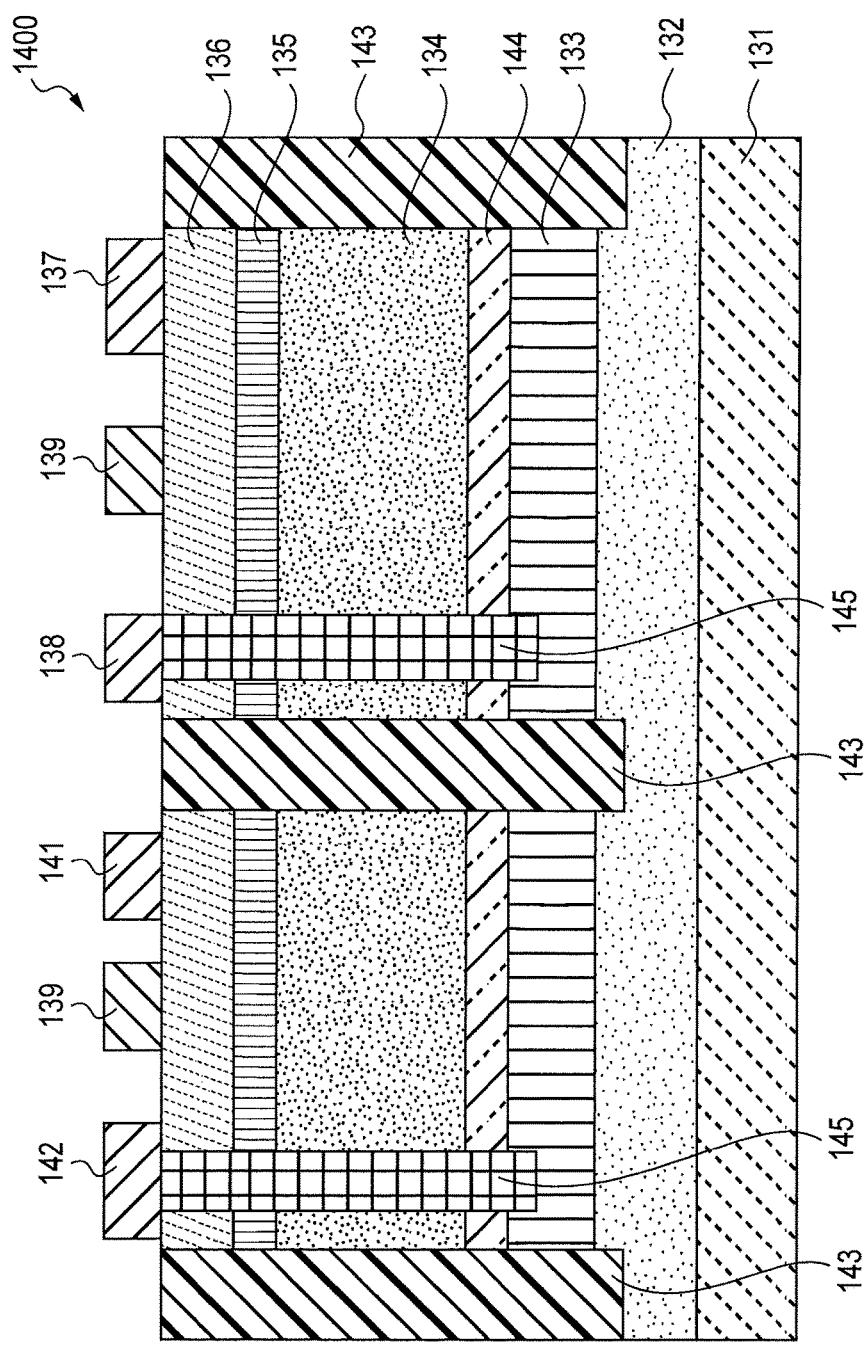
FIG. 14 illustrates a cross-sectional view of an integrated semiconductor device, in accordance with embodiments described herein.

Referring to FIG. 14, another integrated semiconductor device 1400 having a parallel channel configuration is shown, including multiple semiconductor devices similar to semiconductor device 1300 described above in connection with FIG. 13. Integrated device 1400 also includes a back barrier layer 144 between the parallel current conducting layer 133 and buffer layers 134. Back barrier layer may be composed of a high Al-content AlGaN or AlN material. Providing back barrier layer 144 between the parallel current conducting layer 133 and buffer layers 134 increases the breakdown voltage of integrated device 1400 by preventing electrons from migrating from parallel current conducting region 133 to contacts 137, 138, 141, 142.

Integrated semiconductor device 1400 also includes metal channel connections 145, which are composed of a metal material and extend from parallel current conducting region 133 to contacts 138, 142. Metal channel connections 145 may present advantages over other types of channel connections (such as Si channel connections) for devices using high Al-content materials for the parallel current conducting layer 133, because implanting Si into high Al-content AlGaN material may result in non-conductive material, and thus in a faulty connection. Metal channel connections 145 may be formed by etching the selected areas of metal channel connections 145 from the surface of integrated device 1400 to parallel current conducting region 133, and filling the etched area with metal. The metal used to fill metal channel connections 145 may be the same metal used for contacts 137, 138, 141, 142, such as Ti, Al, TiN, W or any other suitable metal, or combinations thereof.

Figure 15:
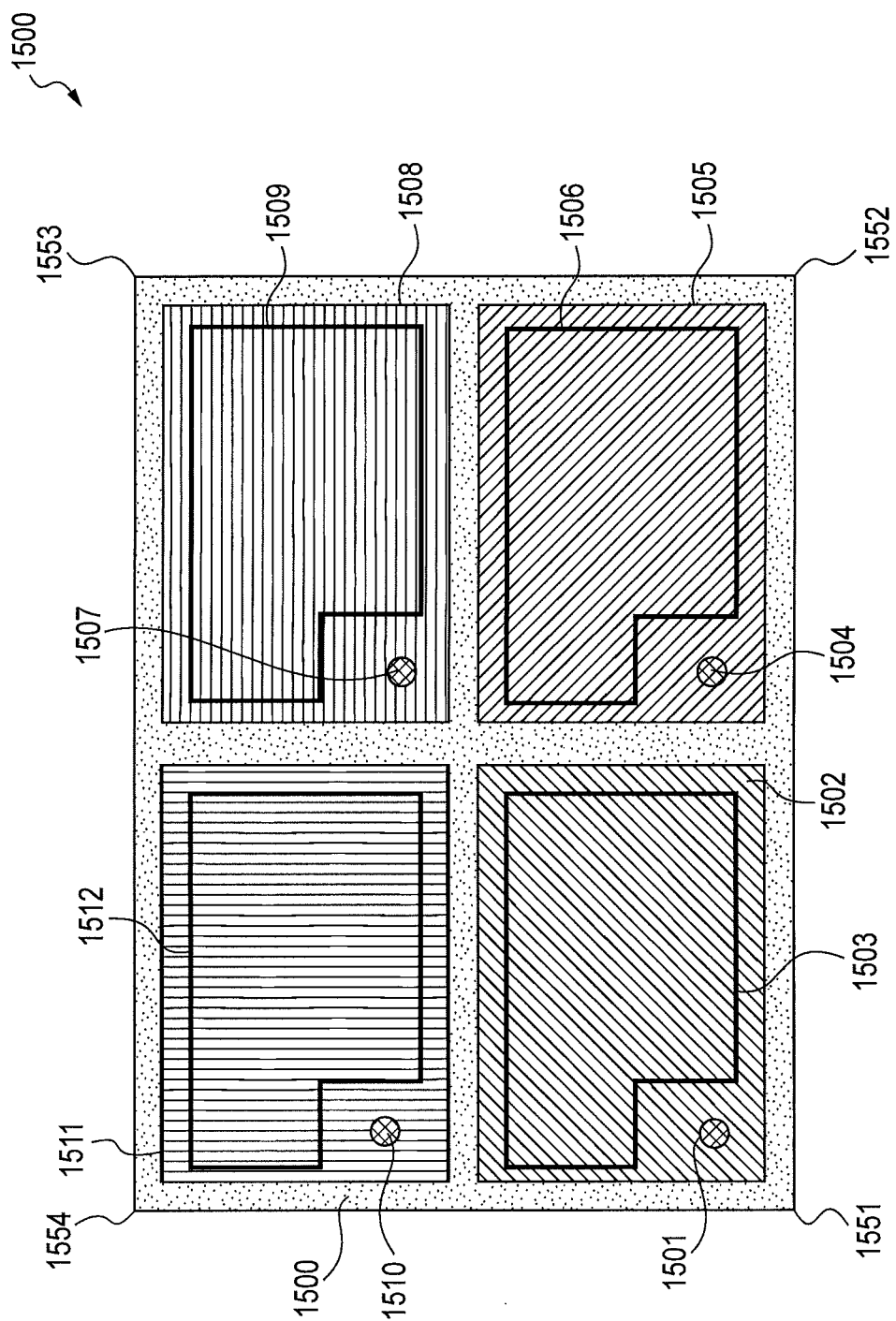
FIG. 15 illustrates a top-down view of an integrated semiconductor device, in accordance with embodiments described herein.

Referring to FIG. 15, a top-down view of an integrated semiconductor device 1500 is shown. Integrated semiconductor device 1500 includes four individual semiconductor devices 1551, 1552, 1553, 1554 integrated on a single substrate 1500. Each semiconductor device in integrated semiconductor device 1500 includes a respective implant region 1502, 1505, 1508, 1511, in each of which a respective implanted well 51 (FIG. 4) is formed beneath a surface, and active device regions 1503, 1506, 1509, 1512 where device layer 54 (FIG. 4) and electrical connections (e.g., contacts 55, 57, and gate 56 of FIG. 4) are formed for each device. Within each implant region 1502, 1505, 1508, 1511, but outside of the respective active device regions 1503, 1506, 1509, 1512, are vias 1501, 1504, 1507, 1510, which can be used to provide a very low inductance and low resistance path from a respective implanted well to a front side connection of the respective semiconductor device (e.g., a source and/or drain contact). Semiconductor devices 1551, 1552, 1553, 1554 may include semiconductor devices as described above in reference to any of FIGS. 1 to 14, and preferably include at least one semiconductor device as described in reference to any of FIGS. 4 to 14. Features described above with regard to FIGS. 4 to 14 may be used to provide each respective semiconductor device with an independently controlled back surface potential which is isolated from the substrate potential and/or conducting regions which are isolated from those of neighboring devices.

Figure 16:
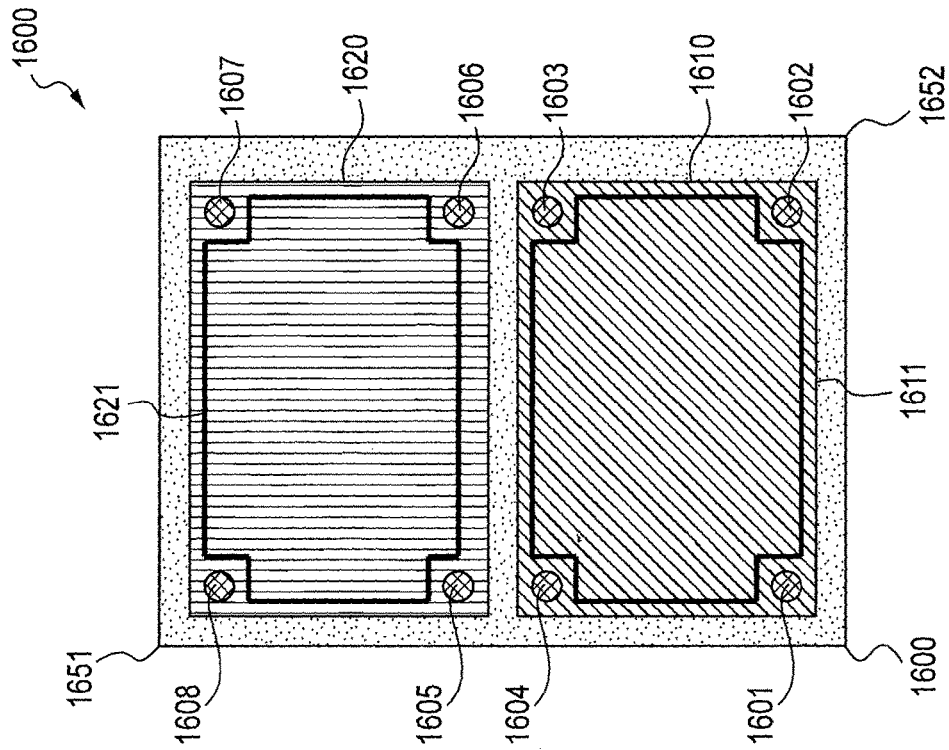
FIG. 16 illustrates a top-down view of an integrated semiconductor device, in accordance with embodiments described herein.

Referring to FIG. 16, a top-down view of another integrated semiconductor device 1600 is shown. Integrated semiconductor device 1600 includes two individual semiconductor devices 1651, 1652 integrated on a single substrate. Each semiconductor device includes an active region 1610, 1620 with multiple (in this case, four) vias 1601-1608 at connections for the semiconductor devices 1651, 1652.

Semiconductor devices 1651, 1652 may include semiconductor devices as described above in reference to any of FIGS. 1 to 14, and preferably include at least one semiconductor device as described in reference to any of FIGS. 4 to 14. Features described above with regard to FIGS. 4 to 14 may be used to provide each respective semiconductor device with an independently controlled back surface potential which is isolated from the substrate potential, and/or conducting regions which are isolated from those of neighboring devices, or from other conducting regions within the same device.

The semiconductor devices described above can be used for numerous purposes. For example, the structures and processes described above can be used to form active devices in a substrate that operate as part of an integrated circuit. General categories of such devices may include diodes, bipolar junction transistors ("BJT"), and field effect transistors ("FET").

Figure 17:
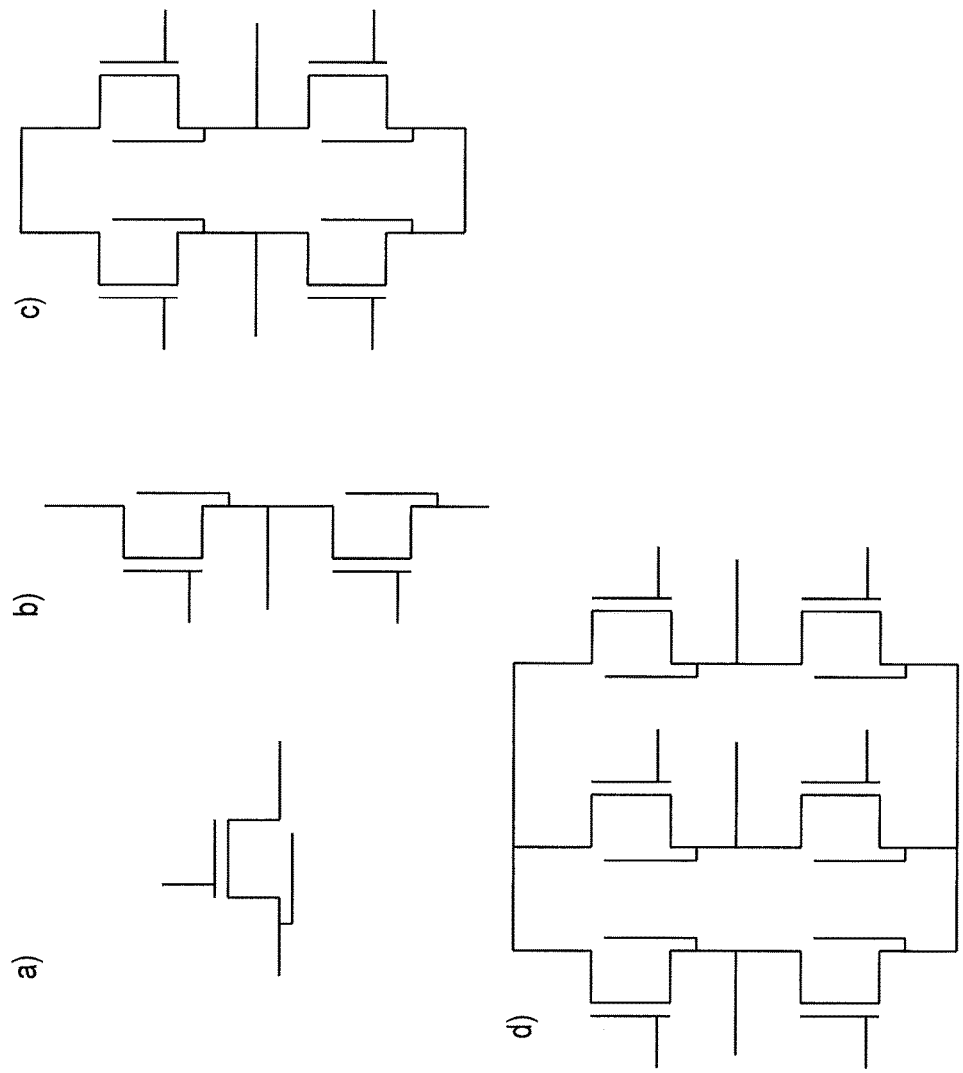
FIG. 17 illustrates schematic diagrams of integrated semiconductor devices, in accordance with embodiments described herein.

Referring to FIG. 17, schematic diagrams of examples of integrated semiconductor devices are shown. The schematic diagrams include (a) a single transistor; (b) a pair of transistors connected in series to form a half bridge, (c) a group of four transistors connected to form a full bridge circuit, and (d) a group of six transistors connected to form a 3 phase bridge. Groups of transistors formed in parallel (i.e., as shown in configuration (c)), can be used to form high-speed switching circuits.

Figure 18:
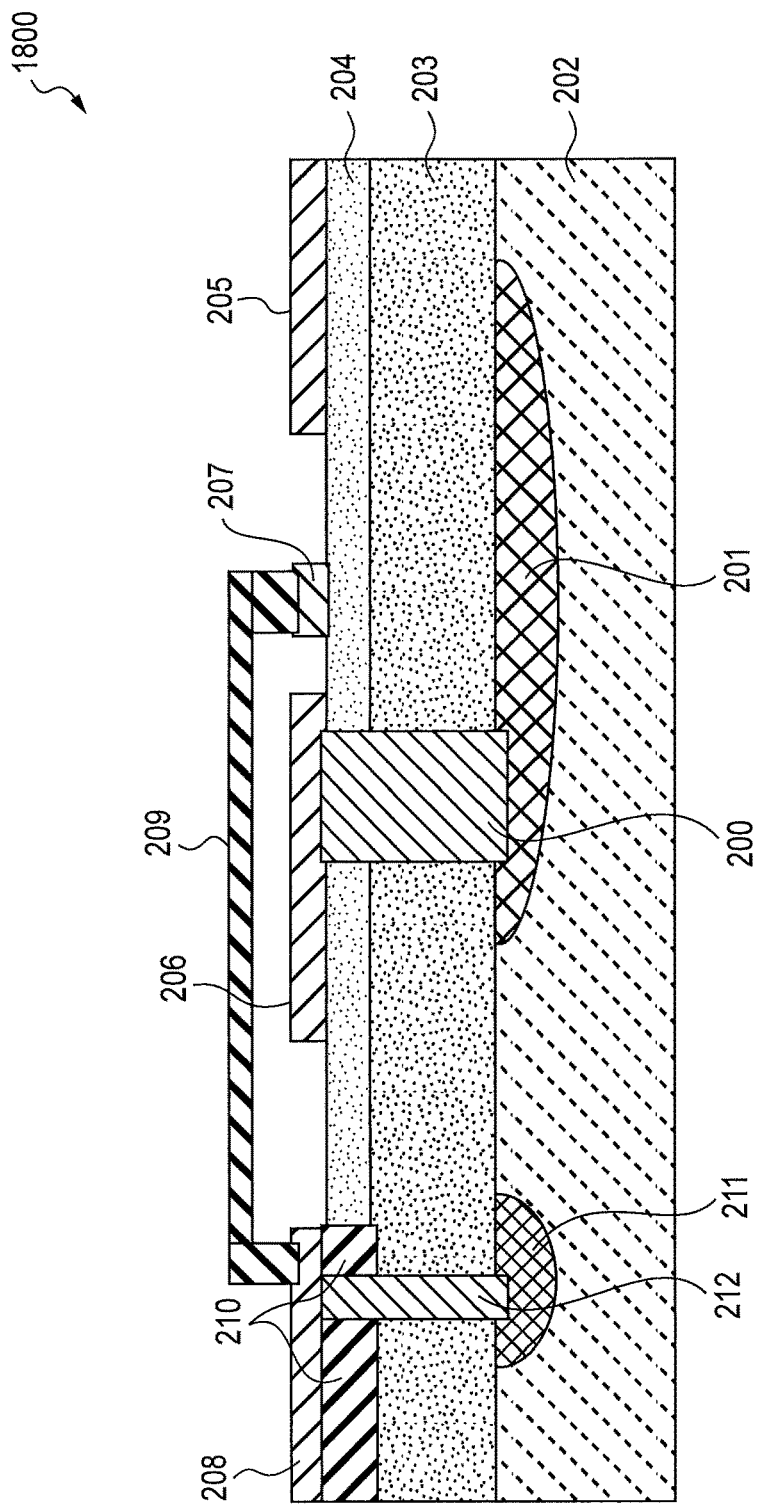
FIG. 18 illustrates a cross-sectional view of an integrated semiconductor device, in accordance with embodiments described herein.

Referring to FIG. 18, an integrated GaN semiconductor device 1800 is shown. Device 1800 includes a substrate 202, buffer layers 203, and device layer 204, which may be formed using materials and processes described above. Device 1800 also includes a drain contact 205, source contact 206, and gate structure 207 formed on device layer 204, which may be formed using materials and processes described above. Device 1800 also includes a via 200 connecting source contact 206 to a well 201 formed in the substrate 202 at a backside of device 1800.

Device 1800 also includes a gate protection diode formed between a second conductive well 211 in substrate 202, which can also be referred to as a gate well. The gate protection diode is connected to gate structure 207 through via 212, gate pad 208, and metal routing 209 (or other structures). The gate protection diode protects gate structure 207 from high voltages which may exceed the gate oxide breakdown voltage. Gate pad 208 is formed on a region of device 1800 which is isolated from the device layer 204 by an isolation region 210. Isolation region 210 may be formed by etching away device layer 204 in the desired region, and/or by implanting the region in device layer 204 with materials having high energy atoms, such as Ni, Fe, V, or any other suitable material, which will damage the device layer 204 to prevent conduction. Metal routing 209 connecting the gate structure 207 and the gate pad 208 may be composed of, for example, Al doped with Si and/or Cu. Alternatively, metal routing 209 may be composed of the same metal material used for making drain and source contacts 205, 206, described above, or a poly-Si material, which can be particularly beneficial for use when high temperatures are to be applied subsequently in the fabrication process.

Via 212 extends from gate pad 208 to gate well 211. Gate well 211 is a conductive well region, and is preferably an oppositely-doped material to substrate 202. For example gate well 211 may be composed of n-type material, and substrate 202 may be a p-type substrate, thereby forming a p-n Zener diode between gate well 211 and substrate 202 as the gate-protection diode. In one preferred embodiment, gate well 211 is composed of a heavily-doped n-type material formed over a heavily doped p-type material that is located over the p-type substrate 202. Such a diode can be used to block current flowing between gate pad 208 and substrate 202 until a critical voltage is reached, after which current will flow between gate pad 208 and substrate 202. Negative voltage on gate structure 207 will cause current at a small bias from the forward-biased p-n diode. Unlike conventional gate protection diodes, which may connect the gate structure 207 to a source contact 206, the configuration shown in device 1800 allows excess current to flow to substrate 202 through vias 200, 212, rather than to the source contact 206.

While device 1800, described with reference to FIG. 18, provides protection to gate structure 207 and other elements of device 1800, problems may arise because the voltage at which the current flows across the gate protection diode is based on the voltage between the gate structure 207 and substrate 202. Thus, the biasing of substrate 202 loses some amount of independence.

Figure 19:
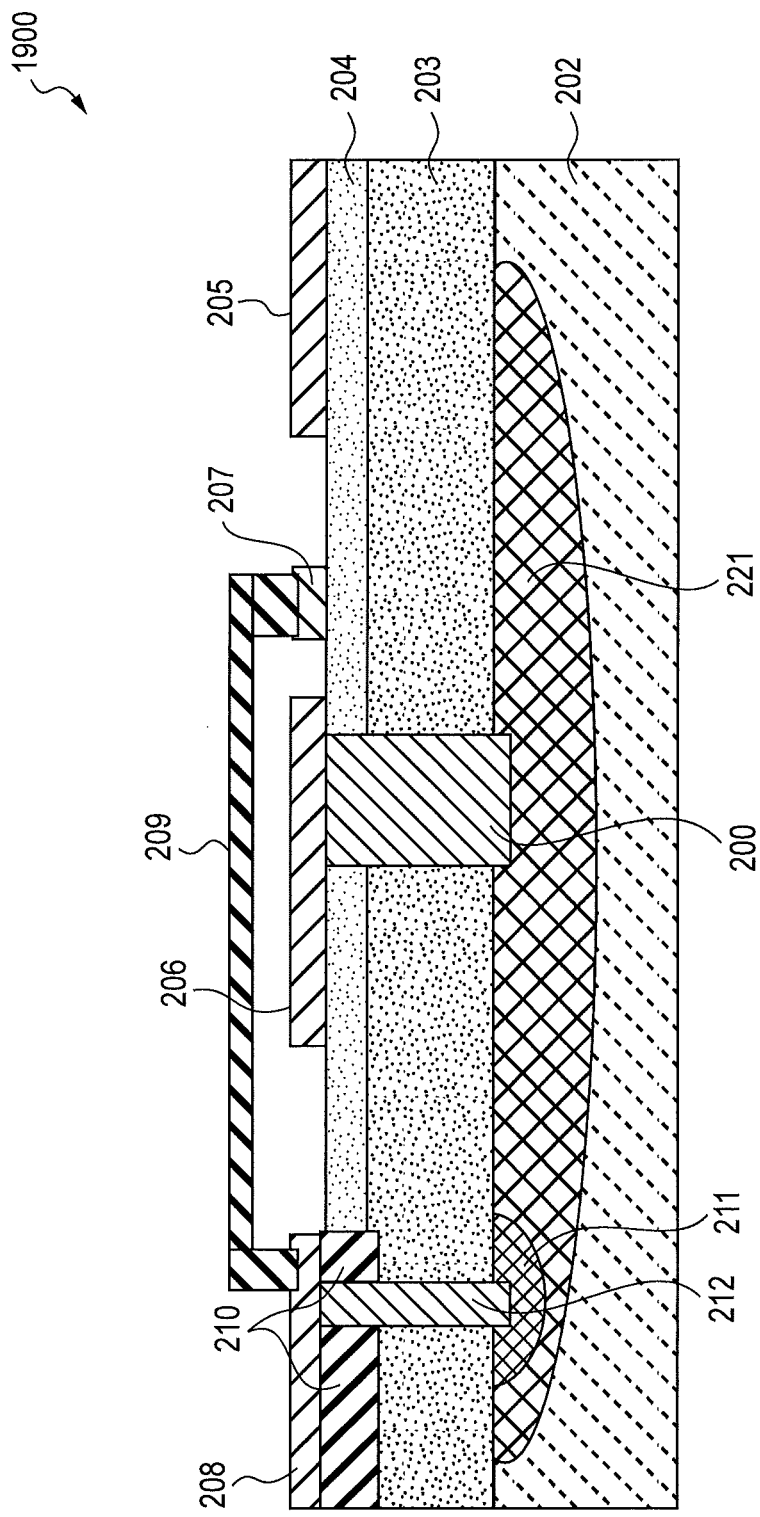
FIG. 19 illustrates a cross-sectional view of an integrated semiconductor device, in accordance with embodiments described herein.

Referring to FIG. 19, another integrated GaN semiconductor device 1900 is shown, where a gate protection diode is formed by a gate well 211 contained within well 221. The gate protect voltage of the gate protection diode is set by the gate-to-source bias of device 1900, rather than the gate-to-substrate bias (as in device 1800 of FIG. 18), thus allowing an independent substrate bias. Although not shown in FIG. 19, it should be understood that the isolation techniques and structures described above with regard to FIGS. 1 to 17 may be used to further isolate well 221 from substrate 202 and buffer layers 203.

Figure 20:
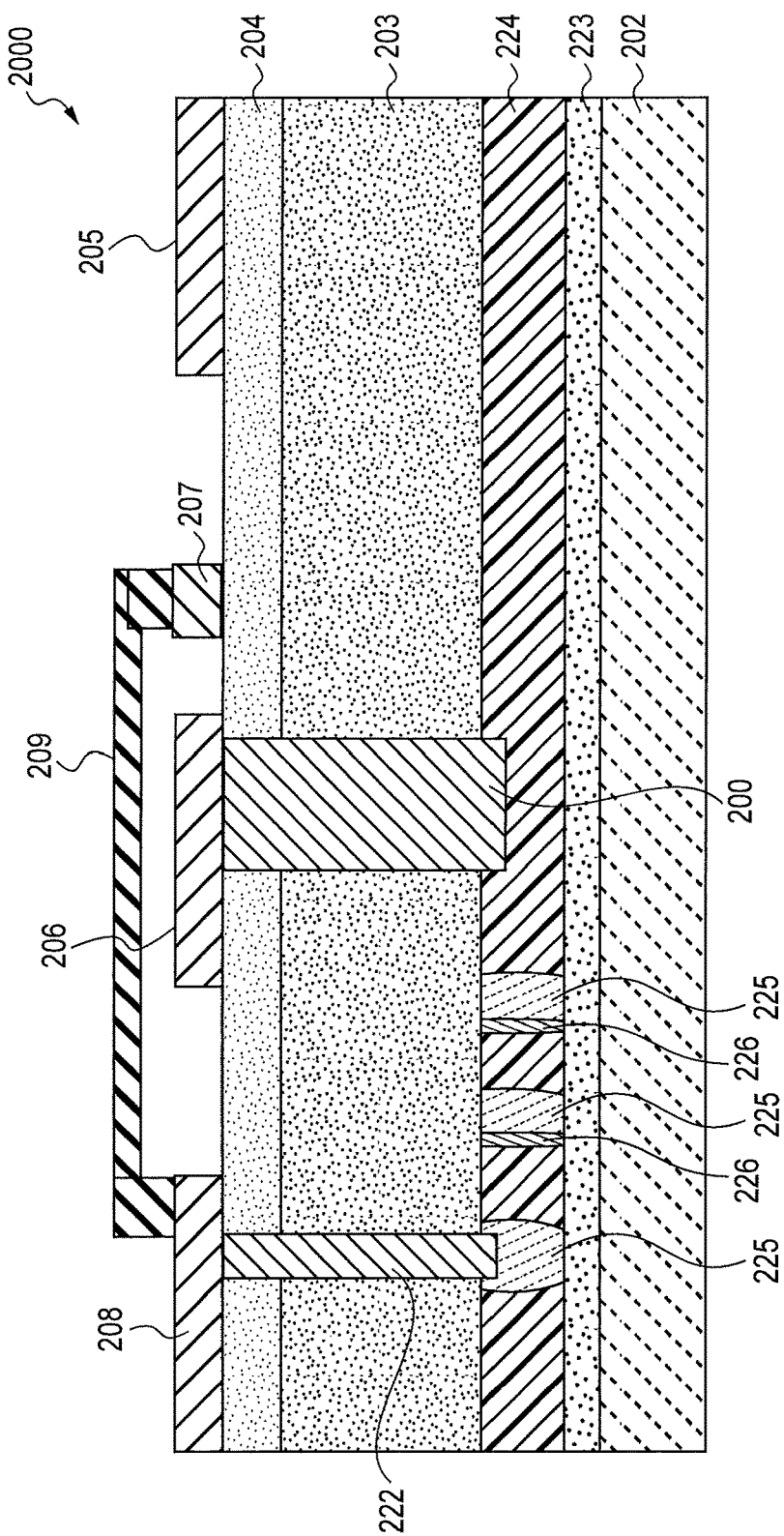
FIG. 20 illustrates a cross-sectional view of an integrated semiconductor device, in accordance with embodiments described herein.

Referring to FIG. 20, another integrated GaN semiconductor active device 2000 is shown. Device 2000 includes multiple forward-biased diodes in series within an SOI layer 224 to form a gate protection circuit. Device 2000 is formed on an SOI substrate, including a substrate 202, a buried oxide layer 223, and an SOI layer 224.

SOI layer 224 may be an n-type material. Diodes are formed within SOI layer 224 from (e.g., p-type) implanted conductive regions 225 and heavily-doped (e.g., n-type) tunnel regions 226, such that the junction between conductive regions 225 and tunnel regions 226 forms a tunnel-type configuration. A tunnel-type contact is one where the doping is so high in the p-n junction (for example, approximately 1e20 atoms/cm$^3$) that no voltage can be blocked. Such a contact may occur when electrons in the n-region can transfer (i.e., tunnel) directly into the valence band of the p-region. Thus, although a p-n junction exists, it appears as an ohmic, or conductive, connection. In one preferred embodiment, each diode may form a voltage drop of approximately one volt, such that five diodes in series would create a voltage drop of approximately five volts. Although an SOI substrate may increase the cost of manufacturing device 2000, the above-described configuration requires fewer implant steps than alternative configurations and provides a natural isolation for the active elements of device 2000 from substrate 202.

Figure 21:
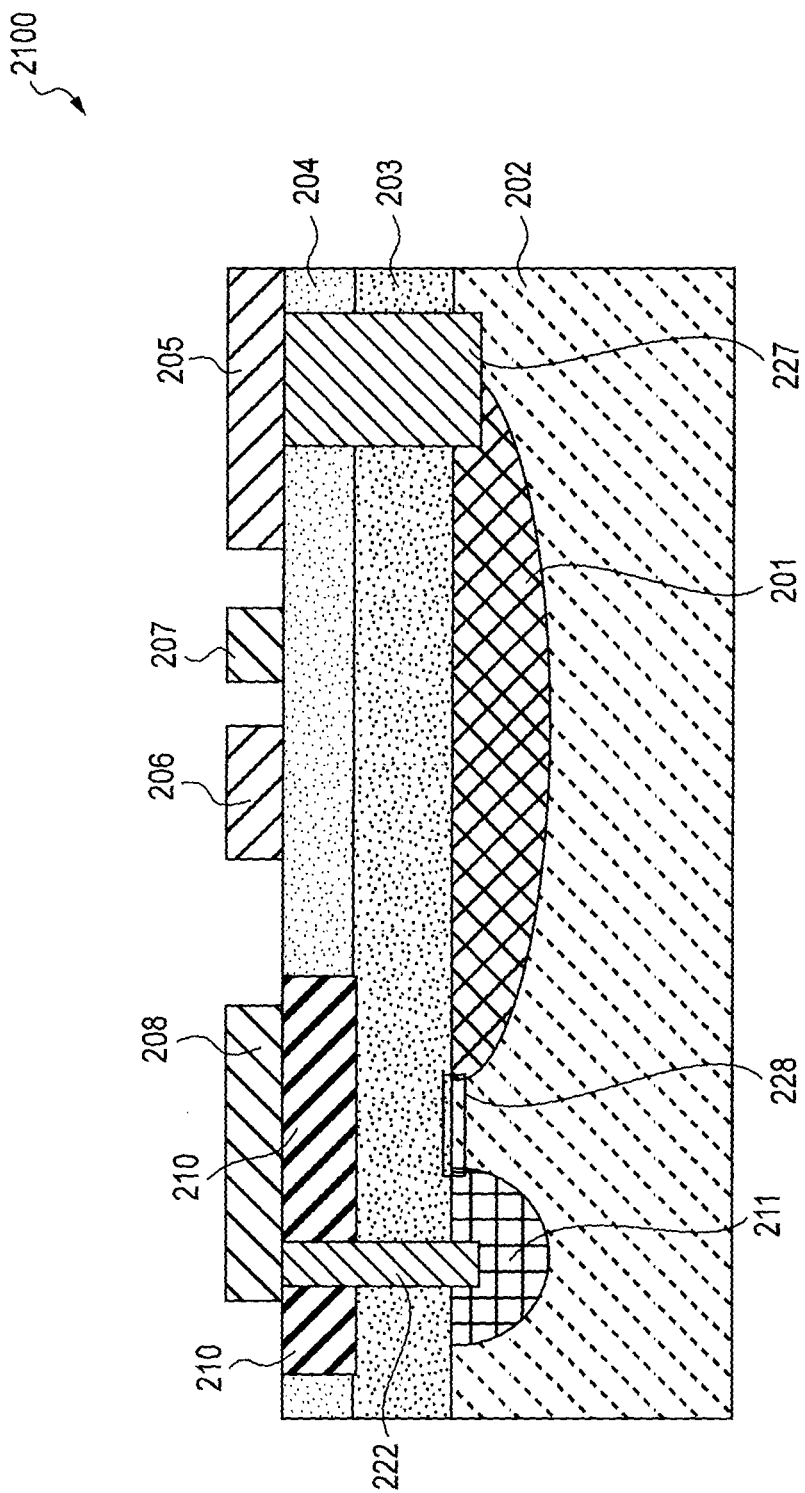
FIG. 21 illustrates a cross-sectional view of an integrated semiconductor device, in accordance with embodiments described herein.

Referring to FIG. 21, another integrated GaN semiconductor active device 2100 is shown. Device 2100 includes a substrate 202, which may be a p-type substrate, and a conductive well 201 and gate well 211, which may be n-type implanted conductive wells.

Device 2100 includes multiple GaN layers used as gate dielectrics to form a recessed FET device with a back channel region 228 formed between gate well 211 and well 201. Device 2100 can be configured to operate similar to a conventional MOSFET device. In device 2100, well region 201 and gate well region 211 act as a drain and a source, respectively, for the recessed FET, while gate pad 208 acts as a gate for the recessed FET. Via 222 shorts gate pad 208 to gate well 211, and via 227 shorts well 201 to substrate 202. In this configuration, well 201 acts as a source for the buried FET. A potential applied at gate pad 208 causes accumulation of electrons in back channel region 228, turning the recessed FET to an "on" state, allowing current to flow between connection 205 or substrate 202 and gate pad 208, and limiting a voltage present at gate pad 208.

Figure 22A:
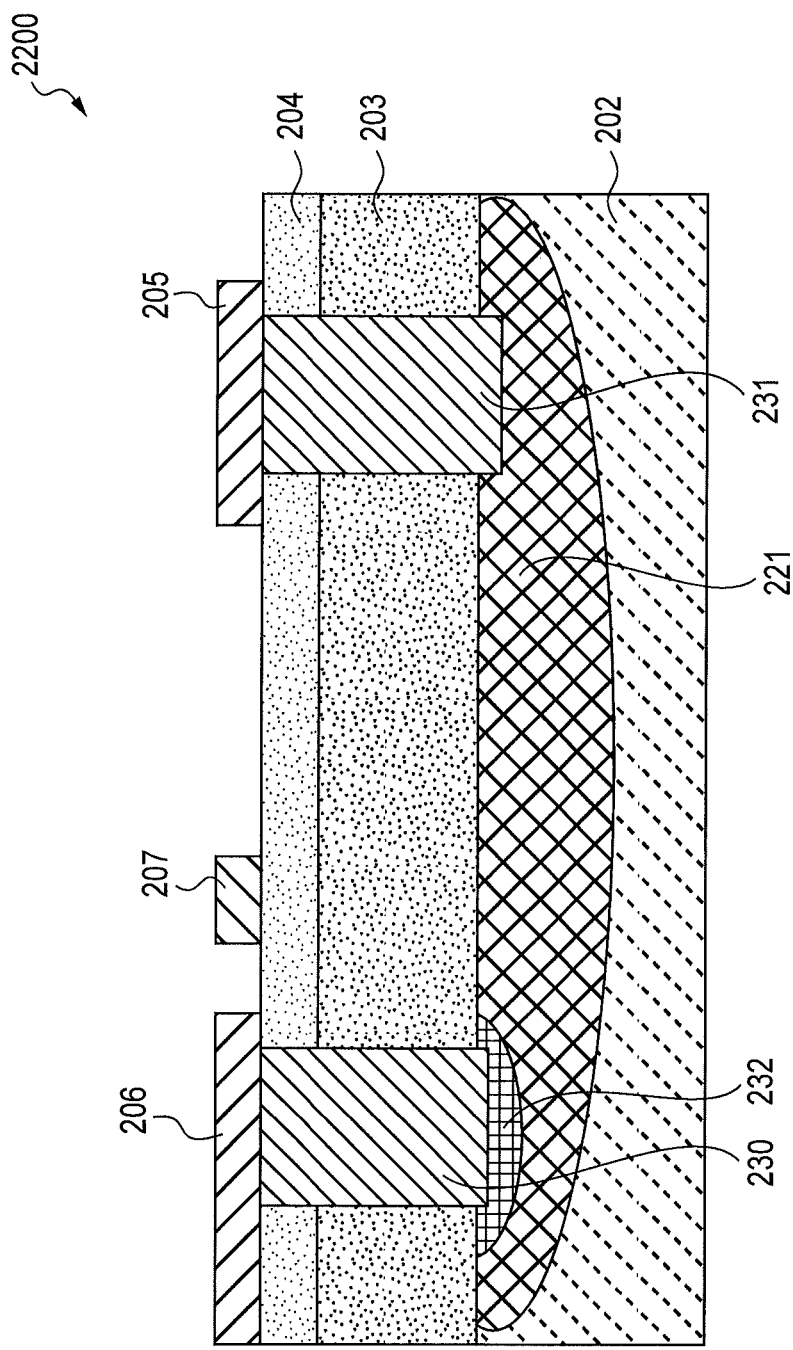
FIG. 22A illustrates a cross-sectional view of an integrated semiconductor device, in accordance with embodiments described herein.

Referring to FIG. 22A, another integrated GaN semiconductor active device 2200 is shown. Device 2200 is a GaN FET device with two vias 230, 231 extending into conductive well 221. A first via 230 connected to a source contact 206 extends into an ohmic region 232 that is formed within conductive well 221. Ohmic region 232 can be formed using a high dose implant of a material having the same carrier type (i.e., n-type or p-type material) used to form conductive well 221. For example, conductive well 221 may be formed of a p-type material having a concentration of approximately 1e16 atoms/cm$^3$; and ohmic region 232 may be formed with a concentration of 5e18 atoms/cm$^3$. A second via 231 connected to a drain contact 205 extends into and creates a Schottky contact with conductive well 221.

During a reverse bias position of device 2200 (e.g., when drain contact 205 is positive compared to source contact 206, and gate structure 207 has a zero bias), the Schottky diode formed by conductive well 221 and region 231 blocks current flow from via 231 into well region 221. When the bias of drain contact 205 becomes negative compared to that of source contact 206, current flows through ohmic region 232 into and across conductive well 221 and up to drain contact 205, while the gate bias remains at zero (and the FET remains in an "off" state).

Device 2200 provides for current flow between source contact 206 and drain contact 205 when gate 207 is "off," with a lower power loss. For example, a conventional threshold voltage for a GaN FET may be approximately 2.1 volts. The voltage drop across the diode formed by region 231 and well 221, on the other hand, is only approximately 0.7 volts, while source contact 206 is electrically connected to conductive well 221 by via 230. Thus, for a constant current, current flow across device 2200 with the gate in an "off" state results in a voltage drop that is approximately 33% of that which is experienced across a conventional GaN FET device.

Figure 22B:
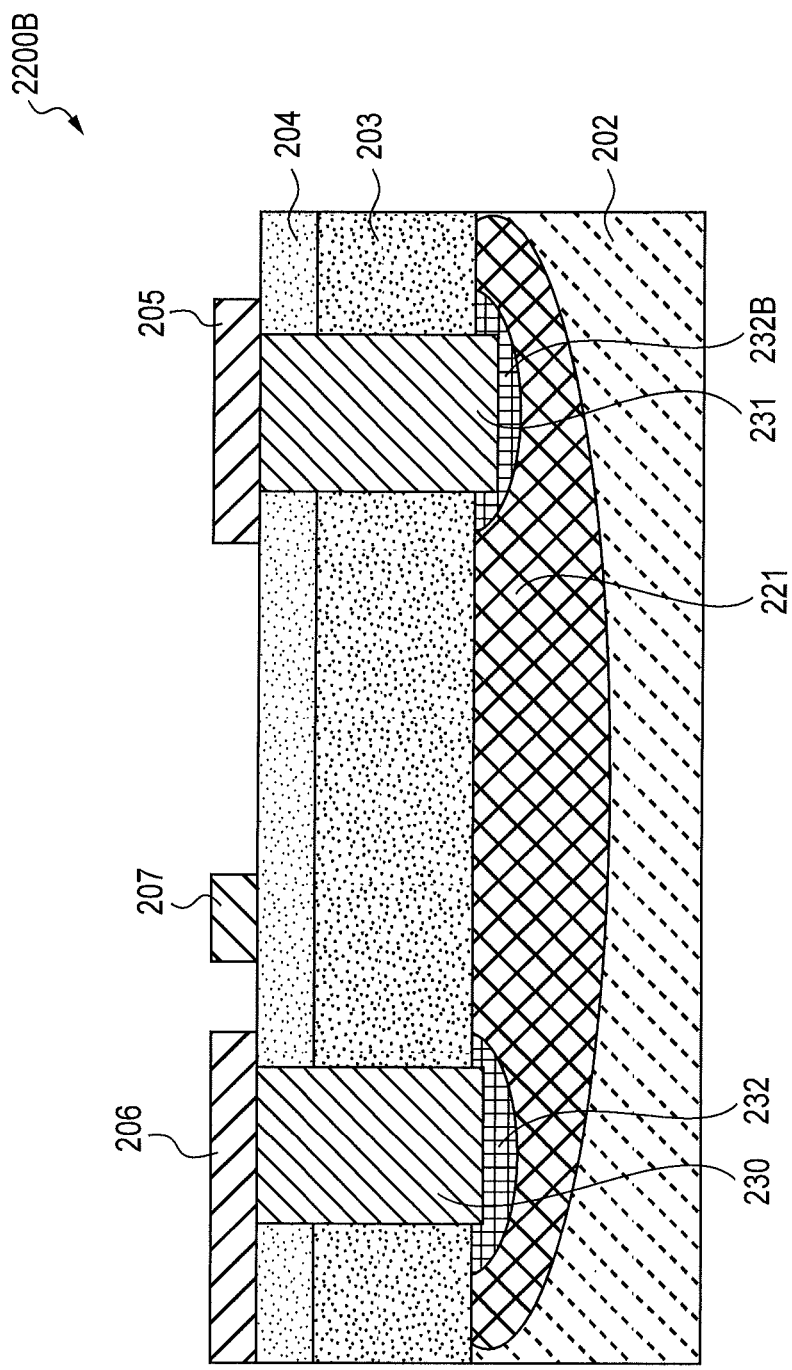
FIG. 22B illustrates a cross-sectional view of an integrated semiconductor device, in accordance with embodiments described herein.

Referring to FIG. 22B, another integrated GaN semiconductor active device 2200B is shown. Device 2200B includes similar features as those discussed in connection with device 2200, but also includes a second ohmic region 232B formed within well 221 under via 231. Second ohmic region 232B can be formed using a high dose implant of a material having the opposite carrier type (i.e., n-type or p-type material) used to form conductive well 221 and ohmic region 232, thereby forming a PIN junction.

Figure 23:
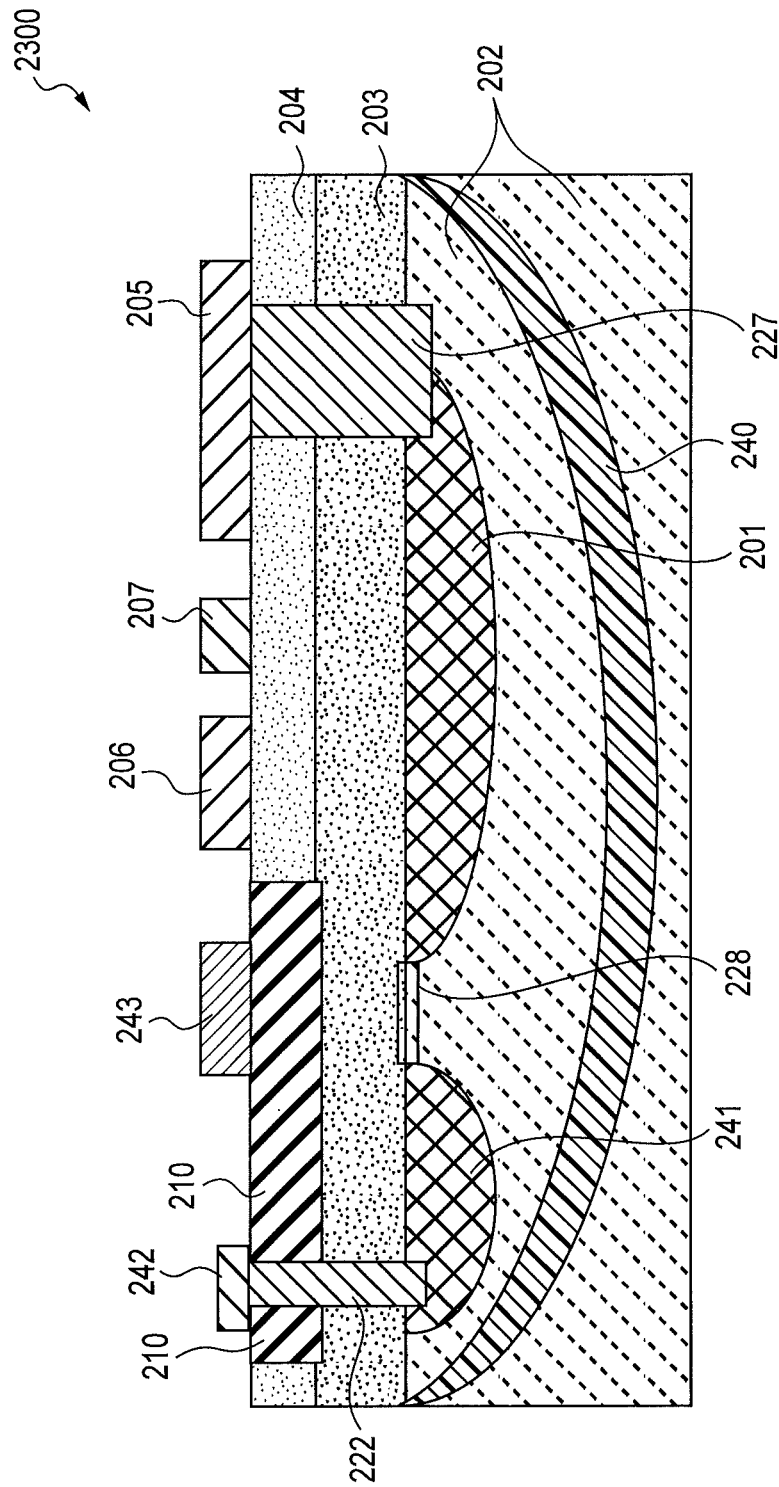
FIG. 23 illustrates a cross-sectional view of an integrated semiconductor device, in accordance with embodiments described herein.

Referring to FIG. 23, another integrated GaN/Si semiconductor device 2300 is shown. Device 2300 includes a recessed Si FET using the buffer layers 203 as a gate insulator. Device 2300 includes a substrate 202, buffer layers 203, device layer 204, contacts 205, 206, gate structure 207, and conductive well 201, which may be formed of similar materials and processes as the elements described above with regard to device 2100 (FIG. 21). Device 2300 also includes isolation region 210, a first via 222, a second via 227, a Si FET well 241, and a back channel region 228 between conductive well 201 and Si FET well 241, which also may be formed of similar materials and processes as the elements described above with regard to device 2100 (FIG. 21). Device 2300 also includes an independent drain and gate structure for the Si FET. Si gate structure 243 and Si FET drain 242 may be formed with similar material and processes as the gate pad 208 described above with regard to device 1800 (FIG. 18), or through any other known suitable materials and processes.

Device 2300 further includes isolation structure 240, which represents one or more of the isolation configurations described above with regard to FIGS. 4 to 22, such as suppression region 111 (FIG. 11), isolation implant 131 (FIG. 12), or isolation region 143 (FIG. 13). It should be understood, however, that any other isolation configurations described above, as well as conventional isolation techniques known in the art, may be represented by isolation structure 240.

Figure 24:
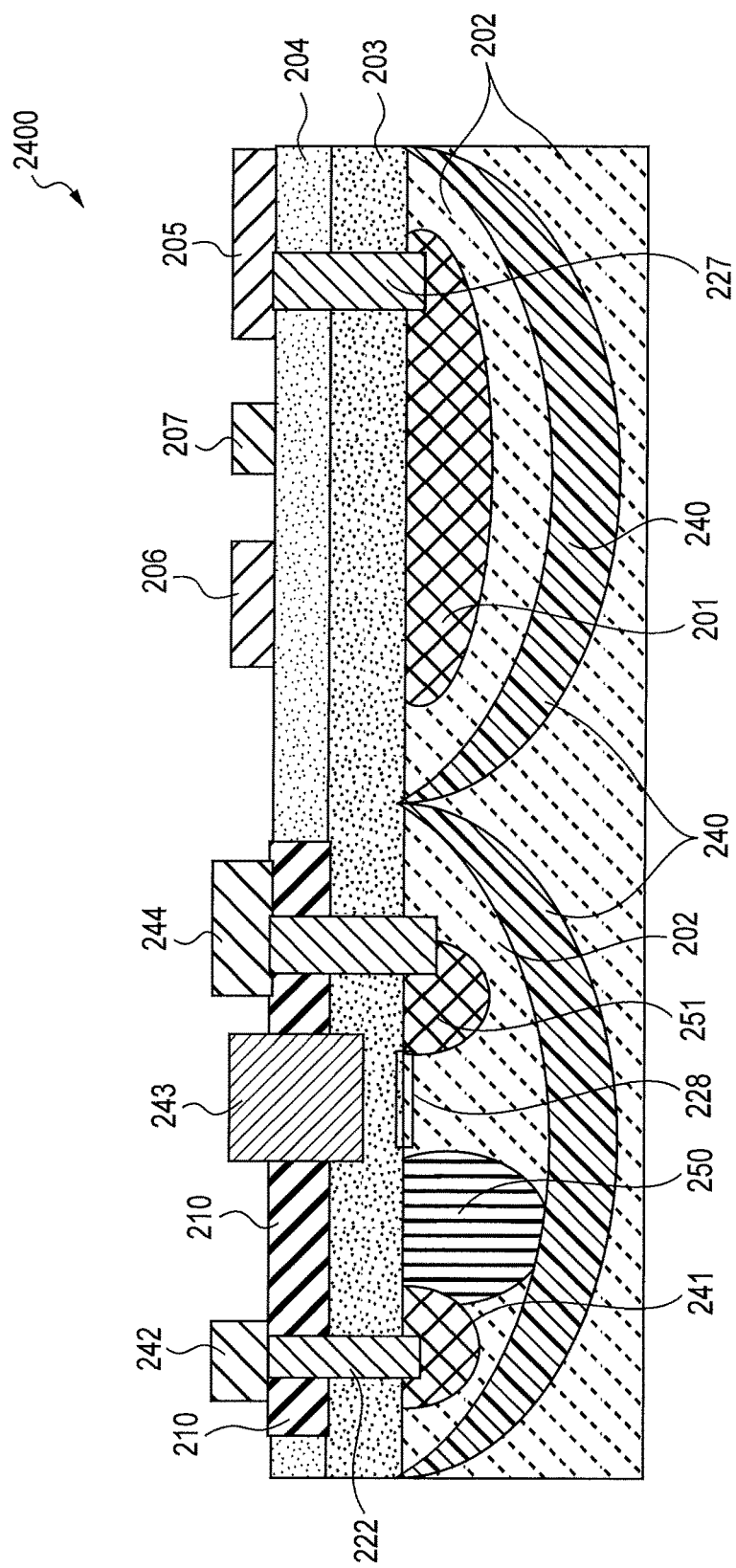
FIG. 24 illustrates a cross-sectional view of an integrated semiconductor device, in accordance with embodiments described herein.

Referring to FIG. 24, another integrated GaN/Si semiconductor device 2400 is shown. Device 2400 includes a substrate 202, buffer layers 203, device layer 204, contacts 205, 206, GaN gate structure 207, and conductive well 201, which may be formed of materials and processes described above. Device 2400 also includes isolation region 210, via 222, via 227, FET well 241, and back channel region 228 between conductive well 251 and FET well 241, which also may be formed of materials and processes described above.

Device 2400 includes an independent FET source 244 and drain 242 contacts, as well as an independent MOS gate 243 which is recessed into device layer 204 and buffer layers 203. Gate 243 may be achieved by etching through device layer 204 and partially through buffer layers 203, until an AlN nucleation layer within buffer layers 203 is reached. Selective etching of GaN can be achieved by addition of O2 during the etching step, or through any other suitable process known in the art.

Device 2400 also includes a low-doped depletion region 250 between FET well 241 and a back channel region 228. Preferably, depletion region 250 has a lower dopant level (e.g., in a range of about 1e14 to 1e17/cm$^2$) than FET well 241 and FET source well 251 (e.g., well 241 and 251 may be doped at 1e17 to 1e19/cm$^2$). This increases the breakdown voltage of the integrated Si FET. Device 2400 provides the capability to integrate p-channel transistors in Si with n-channel transistors in GaN to allow CMOS (complementary metal oxide semiconductor)-type circuits. For example, well 202 may be formed by implantation of antimony at a dose of 4-8e16/cm$^3$ to form a n-type well. Region 250 may be implanted with 1e17/cm$^3$ boron to form an p-type drift well, resulting in a drift well having a net p-type doping of 2e16/cm$^3$. Regions 241 and 251 may be implanted with 1e18 boron to form heavily doped ohmic contact regions. The p-n junction formed between drift well 250 and well 202 will block voltage when the Si FET drain voltage applied to contact 242 is negative and back channel region 228 is in the "off" state. A negative bias at gate 243 will result in accumulation of holes in region 228, turning the device "on". Current can then flow from connection 244 through p-type well 251, through back channel region 228, into drift well 250, and out through contact region 241 and connection 242.

Device 2400 includes isolation structures 240 separating conductive well 201 and wells 241, 251. Isolation structures 240 in FIG. 24 each represent one or more of the isolation configurations described above with regard to FIGS. 4 to 22, such as suppression region 111 (FIG. 11), isolation implant 131 (FIG. 12), or isolation region 143 (FIG. 13). It should be understood, however, that any other isolation configurations described above, as well as conventional isolation techniques known in the art, may be represented by isolation structure 240.

Figure 25A:
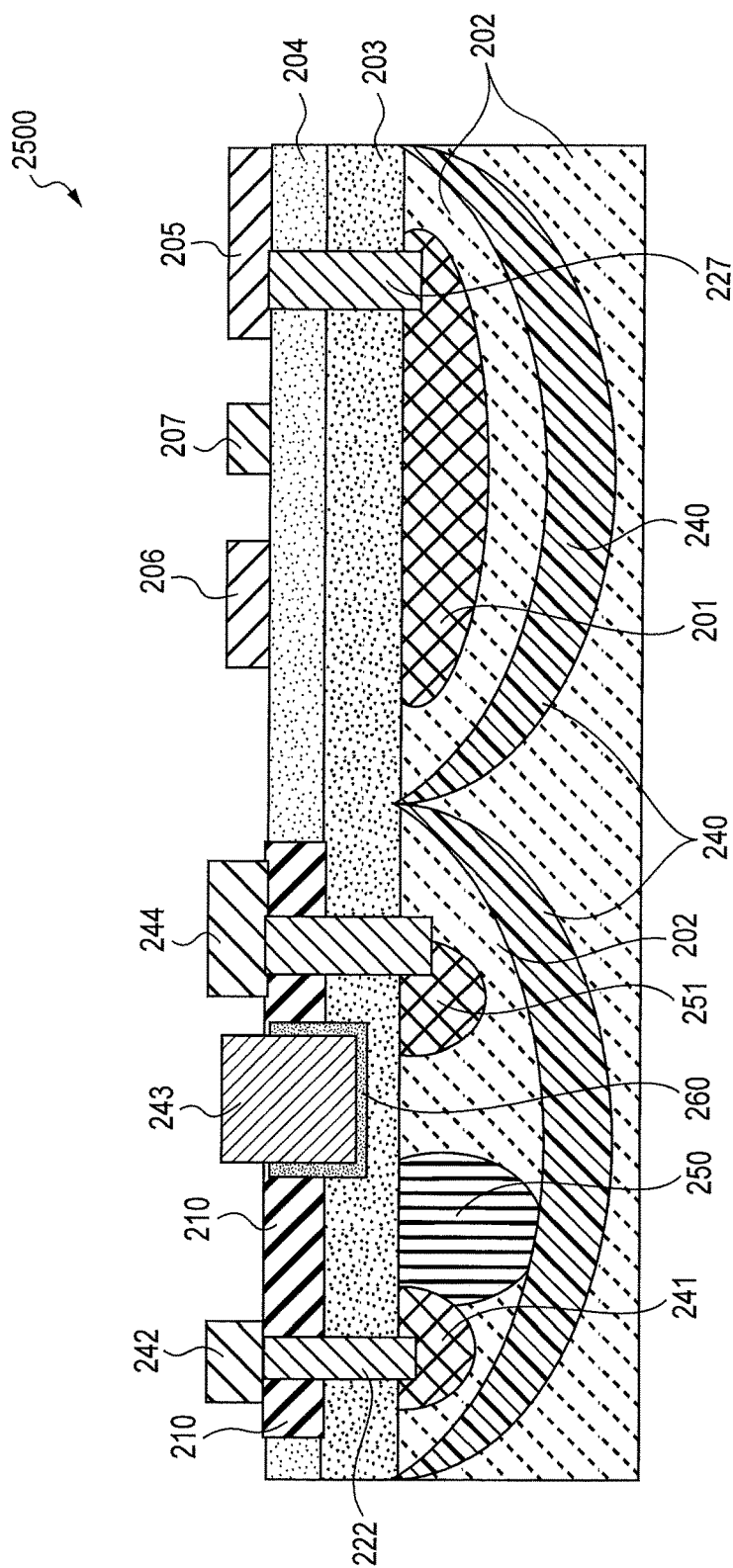
FIG. 25A illustrates a cross-sectional view of an integrated semiconductor device, in accordance with embodiments described herein.

Referring to FIG. 25A, another integrated GaN/Si semiconductor device 2500 is shown. Device 2500 includes similar elements as described above with regard to device 2400 (FIG. 24), and description of those elements will not be repeated here. Device 2500 also includes a high-dielectric constant ("high-k") dielectric material 260 around Si gate 243. High-k dielectric material 260 refers to the material having a higher dielectric constant than the silicon dioxide or similar materials that are typically used in forming gate structures. Adding high-k dielectric material 260 increases gate capacitance while reducing the potential for current leakage. High-k dielectric material 260 may be formed from known suitable materials, and is preferably formed from materials in the family of AlHfSiO$_x$ materials, such as Aluminum Hafnium Silicate, Aluminum Hafnium Dioxide. The most suitable compositions of Al, Hafnium (Hf), and Si in the high-k dielectric material 260 may vary. High-k dielectric material 260 may be deposited at a low-temperature method, for example, using methods such as atomic layer deposition ("ALD"), Plasma-enhanced chemical vapor deposition ("PECVD"), or other suitable deposit methods, prior to formation of gate structure 243. In another embodiment of device 2500, an Si oxidation technique, or a low-temperature oxidation technique combined with deposition of a dielectric, may be used to provide similar benefits at Si gate structure 243.

Figure 25B:
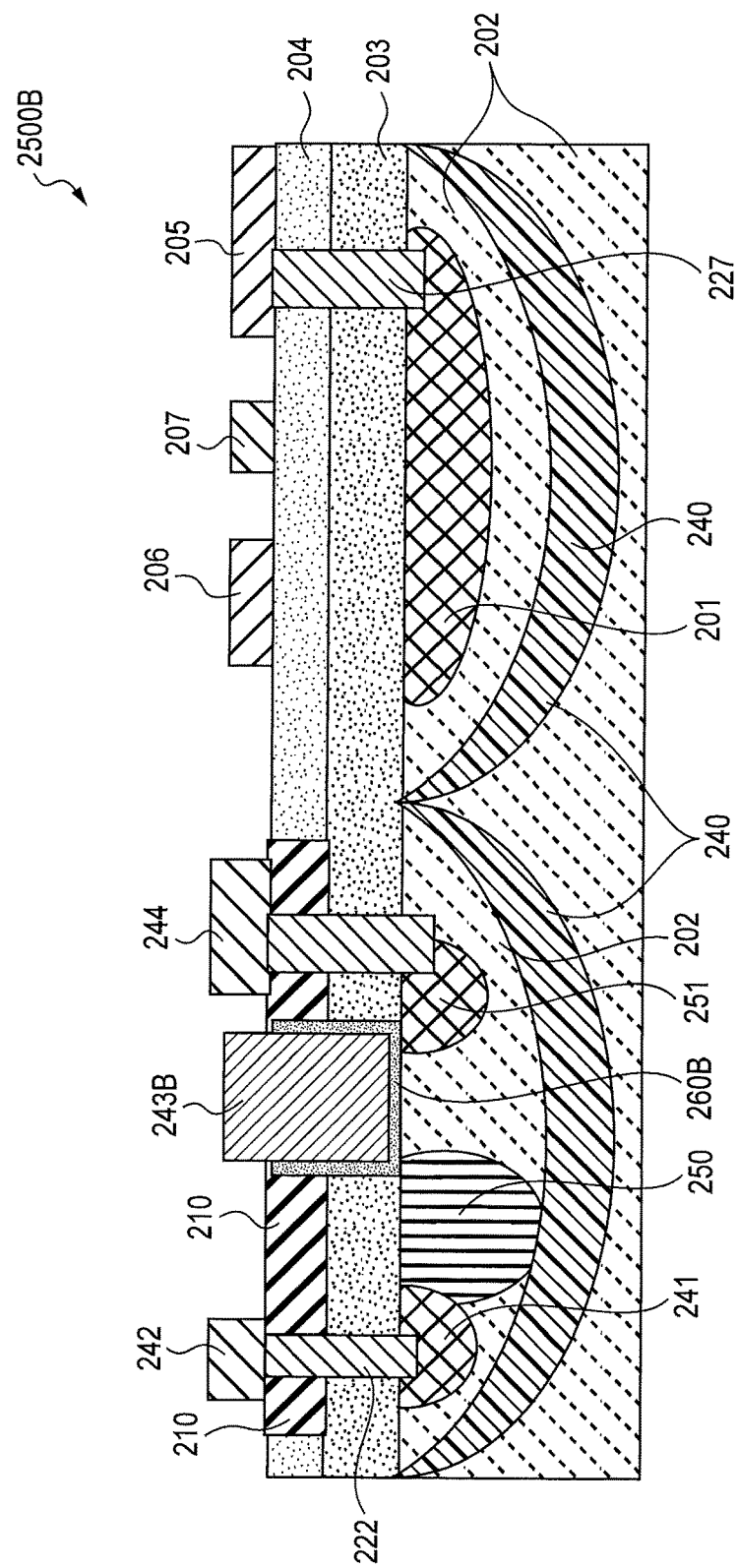
FIG. 25B illustrates a cross-sectional view of an integrated semiconductor device, in accordance with embodiments described herein.

In another embodiment shown in FIG. 25B, device 2500B includes a gate structure 243B with high k insulator 260B etched completely through the buffer layers 203. This results in a gate structure that is formed without buffer layer material between the high-k gate oxide and gate structure 243. The advantages include lower gate voltage required to turn the device on, and the recess step may be combined with the via 222 etch step, reducing cost and complexity of manufacture.

Figure 26:
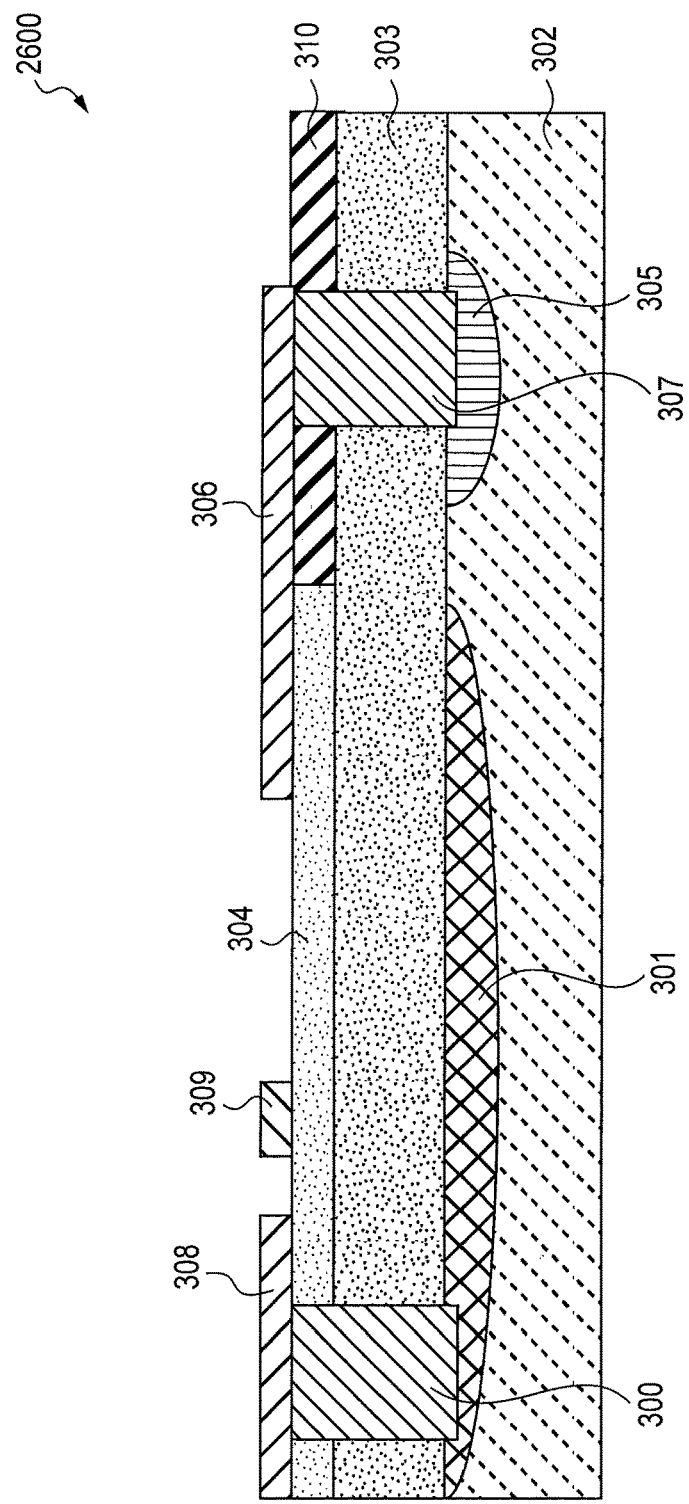
FIG. 26 illustrates a cross-sectional view of a transistor device, in accordance with embodiments described herein.

Referring to FIG. 26, another GaN transistor device 2600 is shown. Device 2600 includes a substrate 302, which may be, for example, Si, SiC, or other semiconductor material, and a conductive well 301 formed in the substrate 302, which is connected to a source contact 308 by a first via 300. Conductive well 301 covers the area beneath the active portion of device layer 304. Device 2600 also includes a second via 307 making an ohmic contact to the region surrounding conductive well 301, forming a neighboring ohmic well 305. Conductive well 301 may be formed of a highly-doped p-type Si material, and ohmic well 305 may be formed of a highly doped n-type Si material, such that the non-implanted portion of substrate 302 between conductive well 301 and ohmic well 305 is a lower-doped material.

Device 2600 advantageously uses the semiconductor characteristics of substrate 302 to protect the device 2600 from high voltage spikes to the drain contact 306. Conductive well 301, ohmic well 305, and the portion of substrate 302 between conductive well 301 and ohmic well 305 form a pin diode. During high voltage spikes at drain contact 306, the pin diode formed between conductive well 301 and ohmic well 305 would experience avalanche conditions, resulting in charge being transferred across substrate 302 to conductive well 301. Conductive well 301, ohmic well 305, and substrate 302 can be doped such that the avalanche conditions across the pin diode would be triggered before the energy of the high voltage spike reaches a critical voltage that could result in damage or destruction of the device 2600. It should be understood that isolation structures described above with regard to FIGS. 1 to 25 may also be incorporated into device 2600, in order to isolate device 2600 and conductive and ohmic wells 301, 305 from neighboring structures and devices.

Figure 27:
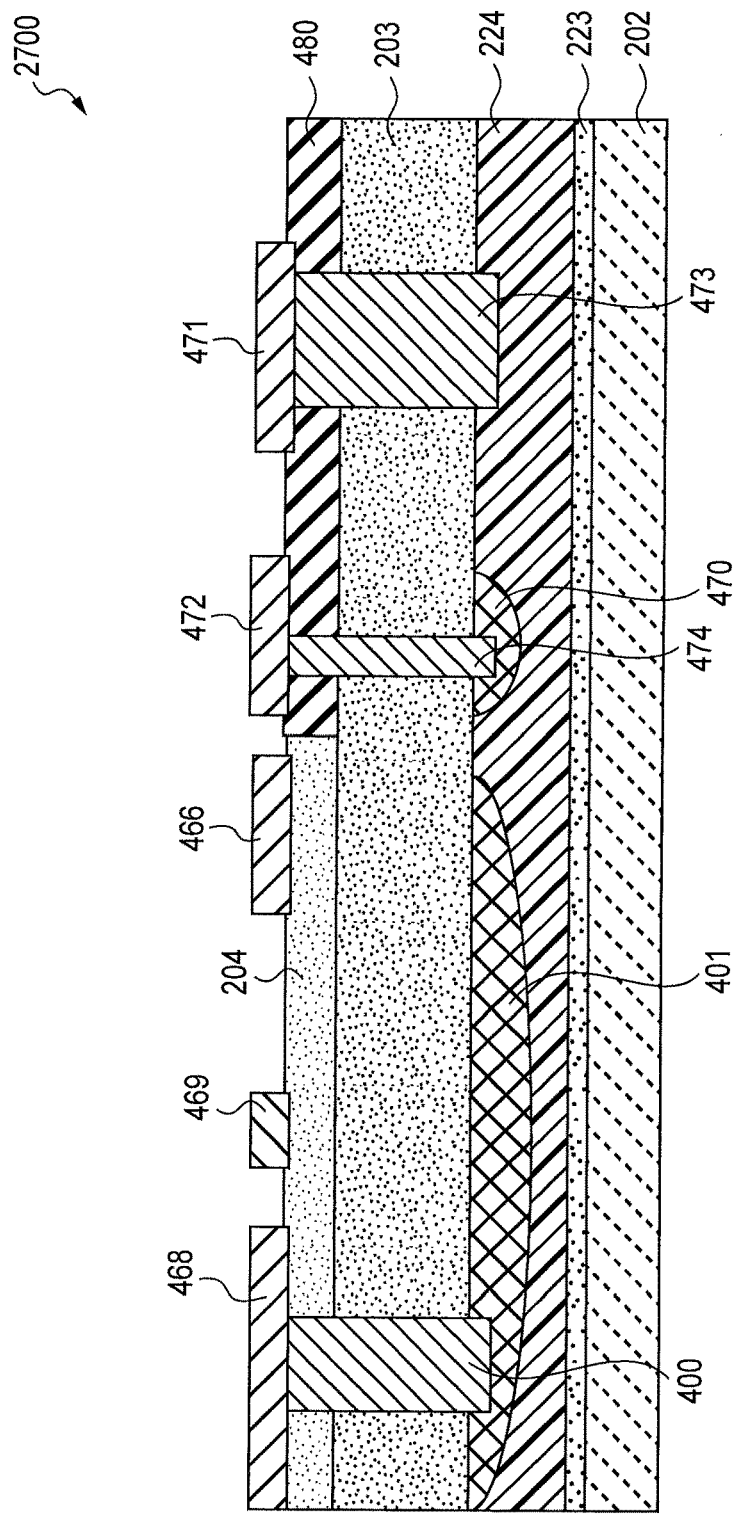
FIG. 27 illustrates a cross-sectional view of an integrated semiconductor device, in accordance with embodiments described herein.

Referring to FIG. 27, another integrated GaN semiconductor active device 2700 is shown. Device 2700 includes a bipolar transistor device integrated within a GaN device, using via connections 400, 473, 474. The GaN portion of integrated device 2700 is formed by GaN drain 466, GaN source 468, and GaN gate 469, which may be formed and operated in accordance with embodiments described above. In device 2700, well 401 is located in the SOI layer 224 in the area under the active region of device layer 204 of the GaN device, and isolates the backside potential of the GaN device.

As shown in FIG. 27, device 2700 includes a SOI insulating structure, as described above with regard to device 2000 (FIG. 20). In one embodiment, well 401 is a p-type well, and SOI layer 224 is formed of an n-type material. It should be understood, however, that any isolation structure described above with regard to any of FIGS. 1-26 may be used instead or in addition. Also, in an alternative embodiment, device 2700 may not include well 401, or may include other types of backside isolation.

The bipolar portion of integrated device 2700 is formed by bipolar drain contact 472 and bipolar base contact 471. Although not shown in FIG. 27, bipolar base contact 471 and bipolar drain contact 472 can be isolated from the active GaN areas of device layer 204 by one or more isolation configurations described above with regard to FIGS. 4-26, such as suppression region 111 (FIG. 11), isolation implant 131 (FIG. 12), or isolation region 143 (FIG. 13).

The bipolar portion of integrated device 2700 is "buried" using vias 473 and 474. The bipolar drain 472 of device 2700 is created using an implanted well 470, with doping in the range of 1e16 to 1e19/cm$^2$, into which via 474 extends from bipolar drain contact 472. Well 470 may be a p-type material in n-type SOI layer 224. In an alternative embodiment, another well (not shown) may be implanted under bipolar base connection 471 to further improve contact, or well 401 may be composed of high and low doped regions to increase breakdown voltage. An example is well regions 401 and 470 implanted with boron of density 1e18/cm$^3$ with SOI layer As doped at 1e17/cm$^3$. Connection via 474 makes contact to the SOI layer, while vias 400 and 474 connect to the collector and emitter regions 401, and 470 respectively. When negative bias is applied at connection 471, the SOI layer becomes negative biased relative to emitter and collector regions 470 and 401. Holes can then conduct through the SOI layer in the region between well 401 and 470.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings, but only by the elements of the claims.

What is claimed is:

1. A method of forming an integrated device comprising a plurality of transistor devices, said method comprising:
   providing a substrate, the substrate having a potential; and
   forming the plurality of transistor devices on the substrate, comprising, for each of the transistor devices, the steps of:
   forming a conductive well in the substrate, wherein the conductive well is electrically isolated in at least one bias polarity from the potential of the substrate;
   forming at least one buffer layer over the substrate and the conductive well;

forming a device layer including a current conducting region over the at least one buffer layer;

forming a source contact and a drain contact on a top surface of the device layer and over the conductive well of the substrate;

forming a conductive via extending from the top surface of the device layer, through the device layer and the buffer layer to penetrate and terminate within the conductive well, and electrically connecting the conductive well to the source contact, such that a potential under the source contact and the drain contact is independent from the potential of the substrate, and the drain contact is independent in potential from a backside of the substrate; and forming an isolation structure in the integrated device to isolate the conductive well of each of the transistor devices from the conductive well of neighboring transistor devices formed on the substrate, such that the potential under the source contact and the drain contact of each of the transistor devices is independent from the potential under the source contact and the drain contact of the neighboring transistor devices.

2. The method of claim 1, wherein the isolation structure in the integrated device is formed by:

forming a photo-resist pattern definition over the device layer in a region between where the source contact and the drain contact are formed;

etching down through layers of the transistor devices in exposed areas of the photo-resist pattern at least below the conductive well;

and filling the etched areas with an isolating material.

3. The method of claim 1, wherein the isolation structure in the integrated device is formed by implanting isolating material into the transistor devices.

4. The method of claim 1, wherein the isolation structure comprises an epitaxially-based substrate isolation structure by forming one or more substrate isolation layers between the substrate and the conductive well.

\* \* \* \* \*